(12) United States Patent
Yun et al.

(10) Patent No.: US 11,968,877 B2
(45) Date of Patent: Apr. 23, 2024

(54) TRANSPARENT DISPLAY DEVICE

(71) Applicant: LG Display Co., Ltd., Seoul (KR)

(72) Inventors: Jeonggi Yun, Paju-si (KR); Taehwan Kim, Paju-si (KR); Jonghan Park, Paju-si (KR); Yong-Il Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 18/056,632

(22) Filed: Nov. 17, 2022

(65) Prior Publication Data

US 2023/0209965 A1 Jun. 29, 2023

(30) Foreign Application Priority Data

Dec. 27, 2021 (KR) .................. 10-2021-0188246

(51) Int. Cl.
*G06F 3/044* (2006.01)
*H10K 59/35* (2023.01)
*H10K 59/40* (2023.01)

(52) U.S. Cl.
CPC .......... *H10K 59/40* (2023.02); *G06F 3/0446* (2019.05); *H10K 59/351* (2023.02); *H10K 59/353* (2023.02); *G06F 2203/04111* (2013.01)

(58) Field of Classification Search
CPC ........ G06F 2203/04111; G06F 3/0412; G06F 3/0443; G06F 3/044; G06F 2203/04112; G06F 3/0446; H10K 59/40; H10K 59/351; H10K 59/353
See application file for complete search history.

(56) References Cited

U.S. PATENT DOCUMENTS

| 2012/0319990 | A1* | 12/2012 | Chan | ...................... G06F 3/0443 345/174 |
| 2019/0198800 | A1* | 6/2019 | Kim | ...................... H10K 50/824 |
| 2020/0174609 | A1* | 6/2020 | Yoo | ........................ G06F 3/047 |
| 2020/0212154 | A1* | 7/2020 | Kim | ...................... H10K 59/131 |

FOREIGN PATENT DOCUMENTS

| KR | 20170059864 A | 5/2017 |
| KR | 20170089460 A | 8/2017 |
| KR | 20200049115 A | 5/2020 |
| KR | 20200131399 A | 11/2020 |

* cited by examiner

*Primary Examiner* — Md Saiful A Siddiqui
(74) *Attorney, Agent, or Firm* — Seed IP Law Group LLP

(57) ABSTRACT

A transparent display device is provided, which may reduce loss of light transmittance due to a touch sensor and a touch line and may make sure of separating a touch sensor electrode of a touch sensor from a cathode electrode of a light emitting element. The transparent display device includes a substrate provided with a plurality of transmissive areas and a non-transmissive area including a plurality of light emission areas, a plurality of light emitting elements respectively disposed in the plurality of light emission areas on the substrate, including an anode electrode, a light emitting layer and a cathode electrode, a plurality of touch sensors respectively disposed in the plurality of transmissive areas on the substrate, including a touch sensor electrode, and a first undercut structure disposed along an edge of the transmissive area to separate the cathode electrode from the touch sensor electrode, including a plurality of eaves.

20 Claims, 18 Drawing Sheets

TRANSPARENT DISPLAY DEVICE

BACKGROUND

Technical Field

The present disclosure relates to a transparent display device.

Description of the Related Art

Recently, studies for a transparent display device in which a user may view objects or images positioned at an opposite side through the display device are actively ongoing. The transparent display device includes a display area on which an image is displayed, wherein the display area may include a transmissive area capable of transmitting external light and a non-transmissive area, and may have high light transmittance through the transmissive area.

Transparent display device may be provided with a plurality of touch sensors and a plurality of touch lines to implement a touch function.

BRIEF SUMMARY

However, the transparent display device in the related art has problems in that it is not easy to form the plurality of touch sensors and the plurality of touch lines or a manufacturing process is complicated and light transmittance may be reduced due to the plurality of touch sensors and the plurality of touch lines. One or more embodiments of the present disclosure addresses one or more technical problems in the related art including the above identified problems. One or more embodiments of the present disclosure provide a transparent display device that may reduce or minimize loss of light transmittance due to a touch sensor and a touch line.

One or more embodiments of the present disclosure provide a transparent display device that may make sure of separating a touch sensor electrode of a touch sensor from a cathode electrode of a light emitting element.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a transparent display device comprising a substrate provided with a plurality of transmissive areas and a non-transmissive area including a plurality of light emission areas, a plurality of light emitting elements respectively disposed in the plurality of light emission areas on the substrate, including an anode electrode, a light emitting layer and a cathode electrode, a plurality of touch sensors respectively disposed in the plurality of transmissive areas on the substrate, including a touch sensor electrode, and a first undercut structure disposed along an edge of the transmissive area to separate the cathode electrode from the touch sensor electrode, including a plurality of eaves.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
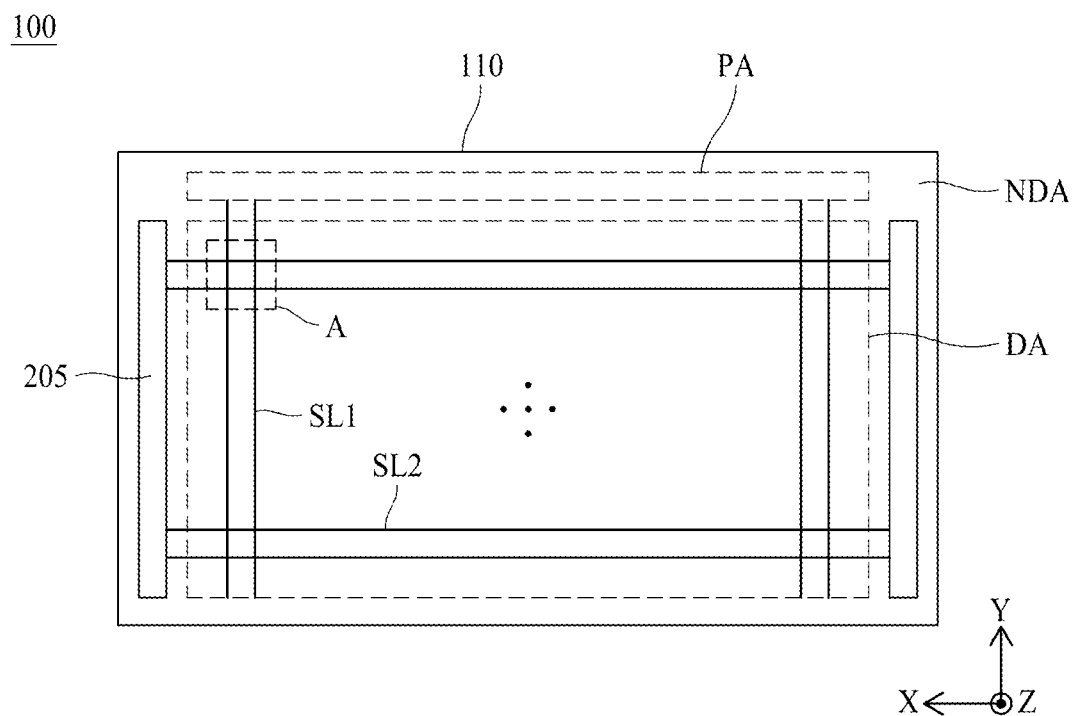
FIG. 1 is a schematic plan view illustrating a transparent display panel.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a dimension (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each element illustrated in the drawing are illustrated for convenience of description, and the present disclosure is not limited to the size and the thickness of the element illustrated, but it is to be noted that the relative dimensions including the relative size, location and thickness of the elements illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a schematic plan view illustrating a transparent display panel.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, a transparent display device 100 according to one embodiment of the present disclosure includes a transparent display panel 110. The transparent display panel 110 may include a display area DA provided with pixels to display an image, and a non-display area NDA for not displaying an image.

The display area DA may be provided with a first signal lines SL1, a second signal lines SL2 and the pixels. The non-display area NDA may be provided with a pad area PA in which pads are disposed, and at least one gate driver 205.

The first signal lines SL1 may be extended in a first direction (e.g., Y-axis direction). The first signal lines SL1 may cross the second signal lines SL2 in the display area DA. The second signal lines SL2 may be extended in the display area DA in a second direction (e.g., X-axis direction). The pixel may be provided in an area where the first signal line SL1 is provided or in an area where the first signal line SL1 and the second signal line SL2 cross each other, and emits predetermined light to display an image.

The gate driver 205 are connected to the scan lines and supplies scan signals to the scan lines. The gate driver 205 may be disposed in the non-display area NDA on one side or both sides of the display area DA of the transparent display panel 110 by a gate driver in panel (GIP) method or a tape automated bonding (TAB) method.

The transparent display panel 110 may further include a touch line and a touch sensor in addition to the first signal line SL1, the second signal line SL2 and the pixel in order to implement a touch function. A detailed description of the touch line and the touch sensor will be described later with reference to FIGS. 2 to 12.

Figure 2:
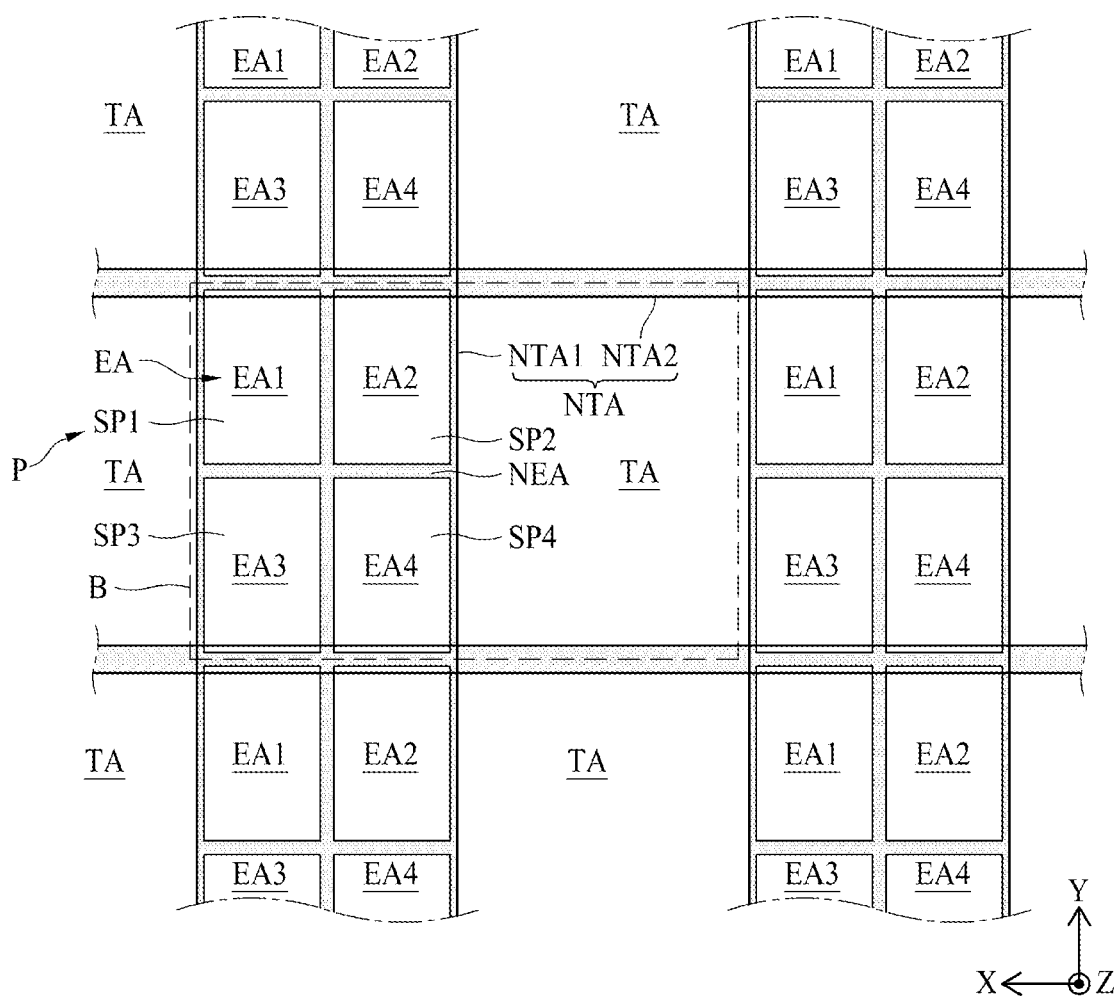
FIG. 2 is a schematic view illustrating an example of a pixel provided in an area A of FIG. 1.
Figure 3:
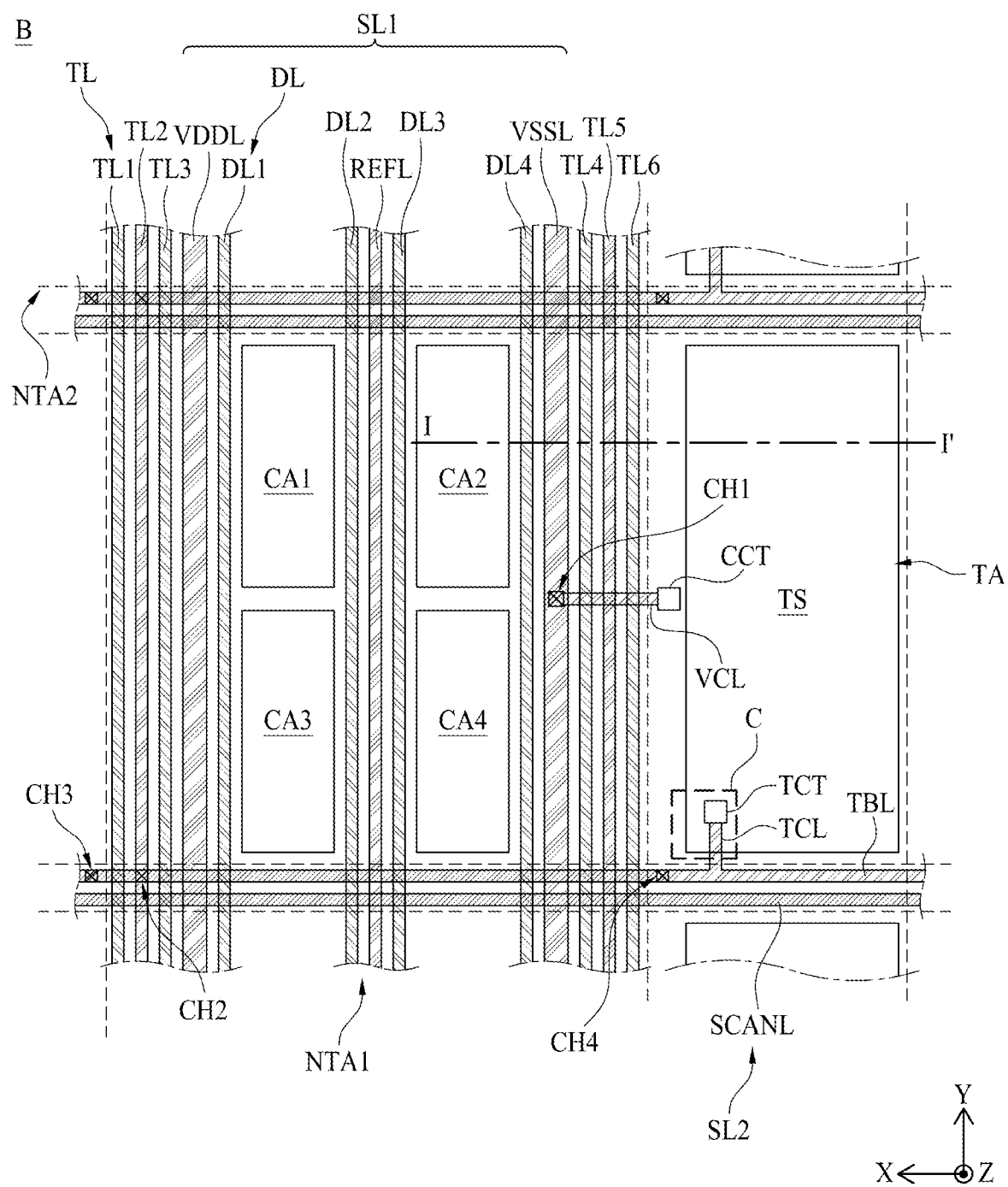
FIG. 3 is a view illustrating an example of signal lines, touch lines and a touch sensor, which are provided in an area B of FIG. 2.

FIG. 2 is a schematic view illustrating an example of a pixel provided in an area A of FIG. 1 and FIG. 3 is a view illustrating an example of signal lines, touch lines and a touch sensor, which are provided in an area B of FIG. 2.

Referring to FIGS. 2 and 3, the display area DA includes a transmissive area TA and a non-transmissive area NTA. The transmissive area TA is an area through which most of externally incident light passes, and the non-transmissive area NTA is an area through which most of externally incident light fails to transmit. A user may view an object or background arranged over a rear surface of the transparent display panel 110 due to the transmissive area TA.

The non-transmissive area NTA may include a first non-transmissive area NTA1, a second non-transmissive area NTA2 and a plurality of pixels P. Pixels P may be provided in the first non-transmissive area NTA1 or in an overlapping area where the first non-transmissive area NTA1 and a second non-transmissive area NTA2 overlap, and emit predetermined light to display an image. A light emission area EA may correspond to an area, from which light is emitted, in the pixel P.

Each of the pixels P, as shown in FIG. 2, may include at least one of a first subpixel SP1, a second subpixel SP2, a third subpixel SP3 and a fourth subpixel SP4. The first subpixel SP1 may include a first light emission area EA1 emitting light of a first color. The second subpixel SP2 may include a second light emission area EA2 emitting light of a second color. The third subpixel SP3 may include a third light emission area EA3 emitting light of a third color. The fourth subpixel SP4 may include a fourth light emission area EA4 emitting light of a fourth color.

The first to fourth light emission area EA1, EA2, EA3 and EA4 may emit light of different colors. For example, the first light emission area EA1 may emit light of a green color. The second light emission area EA2 may emit light of a red color. The third light emission area EA3 may emit light of a blue color. The fourth light emission area EA4 may emit light of a white color. However, the light emission areas are not limited to this example. Each of the pixels P may further include a subpixel emitting light of a color other than red, green, blue and white. Also, the arrangement order of the subpixels SP1, SP2, SP3 and SP4 may be changed in various ways.

The first non-transmissive area NTA1 may be extended in a first direction (e.g., Y-axis direction) in a display area DA, and may be disposed to at least partially overlap light emission areas EA1, EA2, EA3 and EA4. A plurality of first non-transmissive areas NTA1 may be provided in the transparent display panel 110, and a transmissive area TA may be provided between two adjacent first non-transmissive areas NTA1. In the first non-transmissive area NTA1, first signals lines SL1 extended in the first direction (e.g., Y-axis direction) and touch lines TL extended in the first direction (e.g., Y-axis direction) may be disposed to be spaced apart from each other.

For example, the first signal lines SL1 may include at least one of a pixel power line VDDL, a common power line VSSL, a reference line REFL and data lines DL1, DL2, DL3 and DL4.

The pixel power line VDDL may supply a first power source to a driving transistor DTR of each of subpixels SP1, SP2, SP3 and SP4 provided in the display area DA. The first power source may be an anode power source.

The common power line VSSL may supply a second power source to a cathode electrode of the subpixels SP1, SP2, SP3 and SP4 provided in the display area DA. At this time, the second power source may be a cathode power source. The cathode power source may be a common power source commonly supplied to the subpixels SP1, SP2, SP3 and SP4.

The common power line VSSL may supply the second power source to the cathode electrode through a cathode contact portion CCT. The cathode contact portion CCT may be provided between the transmissive area TA and the common power line VSSL. A power connection line VCL may be disposed between the common power line VSSL and the cathode contact portion CCT. One end of the power connection line VCL may be connected to the common power line VSSL through a first contact hole CH1 and the other end thereof may be connected to the cathode contact portion CCT. The cathode electrode may be connected to the cathode contact portion CCT. As a result, the cathode electrode may be electrically connected to the common power line VSSL through the power connection line VCL and the cathode contact portion CCT.

The reference line REFL may supply an initialization voltage (or reference voltage) to the driving transistor DTR of each of the subpixels SP1, SP2, SP3 and SP4 provided in the display area DA. The reference line REFL may be disposed between the plurality of data lines DL1, DL2, DL3 and DL4. For example, the reference line REFL may be disposed at the center of the plurality of data lines DL1, DL2, DL3 and DL4, that is, between the second data line DL2 and the third data line DL3.

The reference line REFL may be diverged and connected to the plurality of subpixels SP1, SP2, SP3 and SP4. In detail, the reference line REFL may be connected to circuit elements of the plurality of subpixels SP1, SP2, SP3 and SP4 to supply an initialization voltage (or reference voltage) to each of the subpixels SP1, SP2, SP3 and SP4.

When the reference line REFL is disposed to be close to the edge of the first non-transmissive area NTA1, a deviation between connection lengths from a diverged point to a circuit element of a plurality of subpixels SP1, SP2, SP3 and SP4 is increased. In a transparent display panel 110 according to one embodiment of the present disclosure, the reference line REFL is disposed in a middle area of the first non-transmissive area NTA1, whereby the deviation between the connection lengths to the circuit element of each of the plurality of subpixels SP1, SP2, SP3 and SP4 may be reduced or minimized. Therefore, the reference line REFL may uniformly supply signals to the circuit elements of the plurality of subpixels SP1, SP2, SP3 and SP4.

Each of the data lines DL1, DL2, DL3 and DL4 may supply a data voltage to the subpixels SP1, SP2, SP3 and SP4. For example, the first data line DL1 may supply a first data voltage to a first driving transistor of the first subpixel SP1, the second data line DL2 may supply a second data voltage to a second driving transistor of the second subpixel SP2, the third data line DL3 may supply a third data voltage to a third driving transistor of the third subpixel SP3 and the fourth data line DL4 may supply a fourth data voltage to a fourth driving transistor of the fourth subpixel SP4.

In the transparent display panel 110 according to one embodiment of the present disclosure, the touch line TL may be further disposed in the first non-transmissive area NTA1. At least two touch lines TL may be provided in one first non-transmissive area NTA1. When the plurality of touch lines TL are disposed in the transmissive area TA of the transparent display panel 110, light transmittance may be deteriorated due to the plurality of touch lines TL.

Also, a slit, specifically an elongated linear or rectangular shape, may be provided between the plurality of touch lines TL. When external light passes through the slit, a diffraction phenomenon may occur. According to the diffraction phenomenon, light corresponding to plane waves may be changed to spherical waves as the light passes through the slit, and an interference phenomenon may occur in the spherical waves. Therefore, constructive interference and destructive interference occur in the spherical waves, whereby the external light that has passed through the slit may have irregular light intensity. As a result, in the transparent display panel 110, definition of an object or image positioned at an opposite side may be reduced. For this reason, there is some technical benefits to dispose the plurality of touch lines TL in the first non-transmissive area NTA1 rather than the transmissive area TA.

A plurality of touch lines TL may be disposed between first signal lines SL1 in the first non-transmissive area NTA1 and a transmissive area TA as shown in FIG. 3. For example, six touch lines TL1, TL2, TL3, TL4, TL5 and TL6 may be disposed in one first non-transmissive area NTA1. Three touch lines TL1, TL2 and TL3 of the six touch lines TL1, TL2, TL3, TL4, TL5 and TL6 may be disposed between a pixel power line VDDL and the transmissive area TA, and the other three touch lines TL4, TL5 and TL6 may be disposed between a common power line VSSL and the transmissive area TA, but are not limited to this arrangement. It is beneficial to have the plurality of touch lines TL to not overlap circuit areas CA1, CA2, CA3 and CA4 in which circuit elements are disposed, and various modifications may be made in the arrangement order of the plurality of touch lines TL with the first signal lines SL1.

The transparent display panel 110 according to one embodiment of the present disclosure includes a pixel P between adjacent transmissive areas TA, and the pixel P may include light emission areas EA1, EA2, EA3 and EA4 in which a light emitting element is disposed to emit light. Since a size of the non-transmissive area NTA is small in the transparent display panel 110, the circuit element may be disposed to at least partially overlap the light emission areas EA1, EA2, EA3 and EA4. That is, the light emission areas EA1, EA2, EA3 and EA4 may include circuit areas CA1, CA2, CA3 and CA4 in which circuit elements are disposed.

For example, the circuit areas may include a first circuit area CA1 in which a circuit element connected to the first subpixel SP1 is disposed, a second circuit area CA2 in which a circuit element connected to the second subpixel SP2 is disposed, a third circuit area CA3 in which a circuit element connected to the third subpixel SP3 is disposed, and a fourth circuit area CA4 in which a circuit element connected to the fourth subpixel SP4 is disposed.

In the transparent display panel 110 according to one embodiment of the present disclosure, a plurality of touch lines TL do not overlap circuit areas CA1, CA2, CA3 and CA4, so that parasitic capacitance of the touch lines TL due to a circuit element may be reduced or minimized.

Furthermore, the transparent display panel 110 according to one embodiment of the present disclosure may reduce a horizontal distance difference between the touch lines TL. Since at least two transistors and a capacitor are disposed in the circuit areas CA1, CA2, CA3 and CA4, the touch lines TL may be difficult to be formed in a straight line in the circuit areas CA1, CA2, CA3, and CA4, and may be difficult to have a constant horizontal distance. Therefore, the horizontal distance difference between the touch lines TL is increased, whereby uniformity of the parasitic capacitance may be very low.

In the transparent display panel 110 according to one embodiment of the present disclosure, the touch lines TL may be disposed so as not to overlap the circuit areas CA1, CA2, CA3 and CA4, whereby an influence of the circuit element may be reduced and at the same time the horizontal distance difference between the touch lines TL may be reduced to improve uniformity of the parasitic capacitance.

The second non-transmissive area NTA2 may be extended in the display area DA in a second direction (e.g., X-axis direction), and may be disposed to at least partially overlap the light emission areas EA1, EA2, EA3 and EA4. A plurality of second non-transmissive areas NTA2 may be provided in the transparent display panel 110, and the transmissive area TA may be provided between two adjacent second non-transmissive areas NTA2. The second signal line SL2 and a touch bridge line TBL may be disposed to be spaced apart from each other in the second non-transmissive area NTA2.

A second signal line SL2 may be extended in a second direction (e.g., X-axis direction), and may include, for example, a scan line SCANL. The scan line SCANL may supply a scan signal to the subpixels SP1, SP2, SP3 and SP4 of the pixel P.

A touch bridge line TBL may connect any one of the plurality of touch lines TL with a touch sensor TS. The touch bridge line TBL may be connected to any one of the plurality of touch lines TL through a second contact hole CH2. Further, the touch bridge line TBL may be connected to at least two touch sensors TS extended in the second direction (e.g., X-axis direction) while being extended in the second direction (e.g., X-axis direction).

In one embodiment, the touch bridge line TBL may include a plurality of layers, e.g., two layers. The touch bridge line TBL may include a first touch bridge line disposed in a first layer in an area overlapped with the first non-transmissive area NTA1 and a second touch bridge line disposed in a second layer in an area that is not overlapped with the first non-transmissive area NTA1. One first touch bridge line may be connected to one second touch bridge line at one end through a third contact hole CH3, and may be connected to another second touch bridge line at the other end through a fourth contact hole CH4. For example, the first layer may be the same layer as a gate electrode of a driving transistor, and the second layer may be the same layer as a source electrode and a drain electrode of the driving transistor.

In the transparent display panel 110 according to one embodiment of the present disclosure, a plurality of touch lines TL may be disposed in the first non-transmissive area NTA1 that is not a second non-transmissive area NTA2, whereby light transmittance may be prevented from being deteriorated due to the plurality of touch lines TL. The second non-transmissive area NTA2 extended in the second direction (e.g., X-axis direction) crosses between adjacent transmissive areas TA as shown in FIG. 3. When a width of the second non-transmissive area NTA2 crossing the transmissive areas TA is increased, a size of the transmissive area TA is necessarily reduced.

When the plurality of touch lines TL are disposed in the second non-transmissive area NTA2, the width of the second non-transmissive area NTA2 is increased to dispose a large number of lines, and the size of the transmissive area TA is reduced. That is, a problem may occur in that light transmittance of the transparent display panel 110 is reduced due to the plurality of touch lines TL.

In the transparent display panel 110 according to one embodiment of the present disclosure, the plurality of touch lines TL are disposed in the first non-transmissive area NTA1, and only one touch bridge line TBL for connecting the plurality of touch sensors TS are provided in the second non-transmissive area NTA2. Therefore, the transparent display panel 110 according to one embodiment of the present disclosure may reduce or minimize the size decrease of the transmissive area TA or decrease in light transmittance due to the plurality of touch lines TL and the touch bridge line TBL.

The touch sensor TS may be provided in the transmissive area TA. The touch sensor TS may be disposed in each of the plurality of transmissive areas TA, and may be changed in capacitance during user contact. A touch driver (not shown) may be connected to the plurality of touch sensors TS through the plurality of touch lines TL to detect a change in capacitance of the plurality of touch sensors TS.

Hereinafter, a connection relation among a plurality of touch sensors TS, a plurality of touch lines TL and a plurality of touch bridge lines TBL will be described in more detail with reference to FIGS. 4 and 5.

Figure 4:
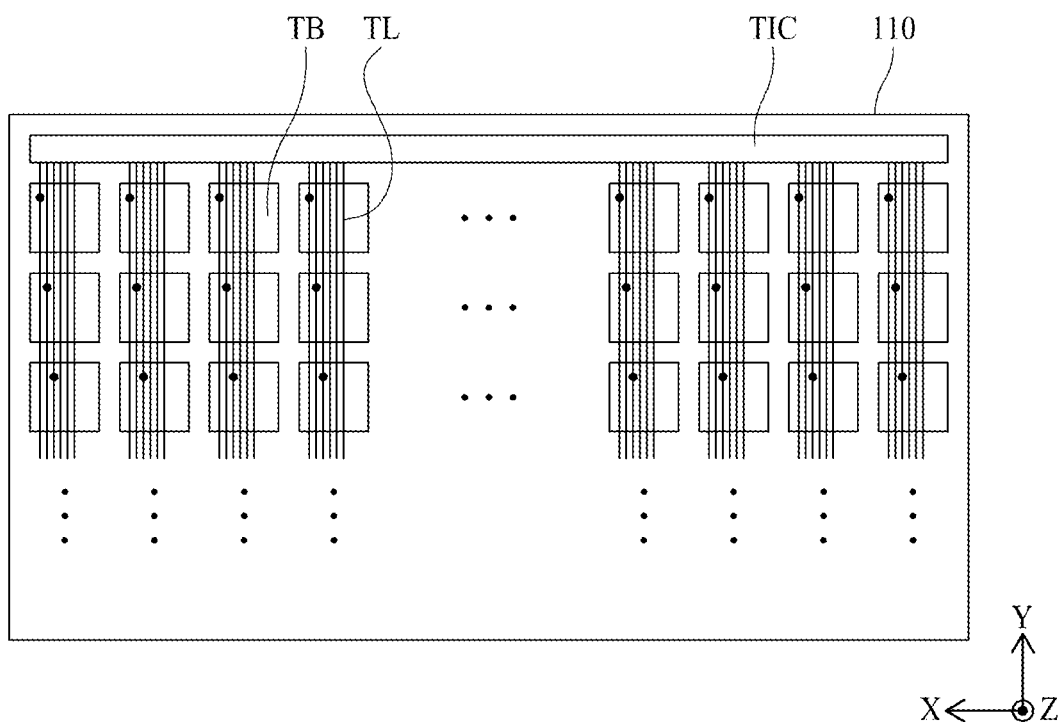
FIG. 4 is a view illustrating a connection relation between a plurality of touch blocks and a plurality of touch lines.
Figure 5:
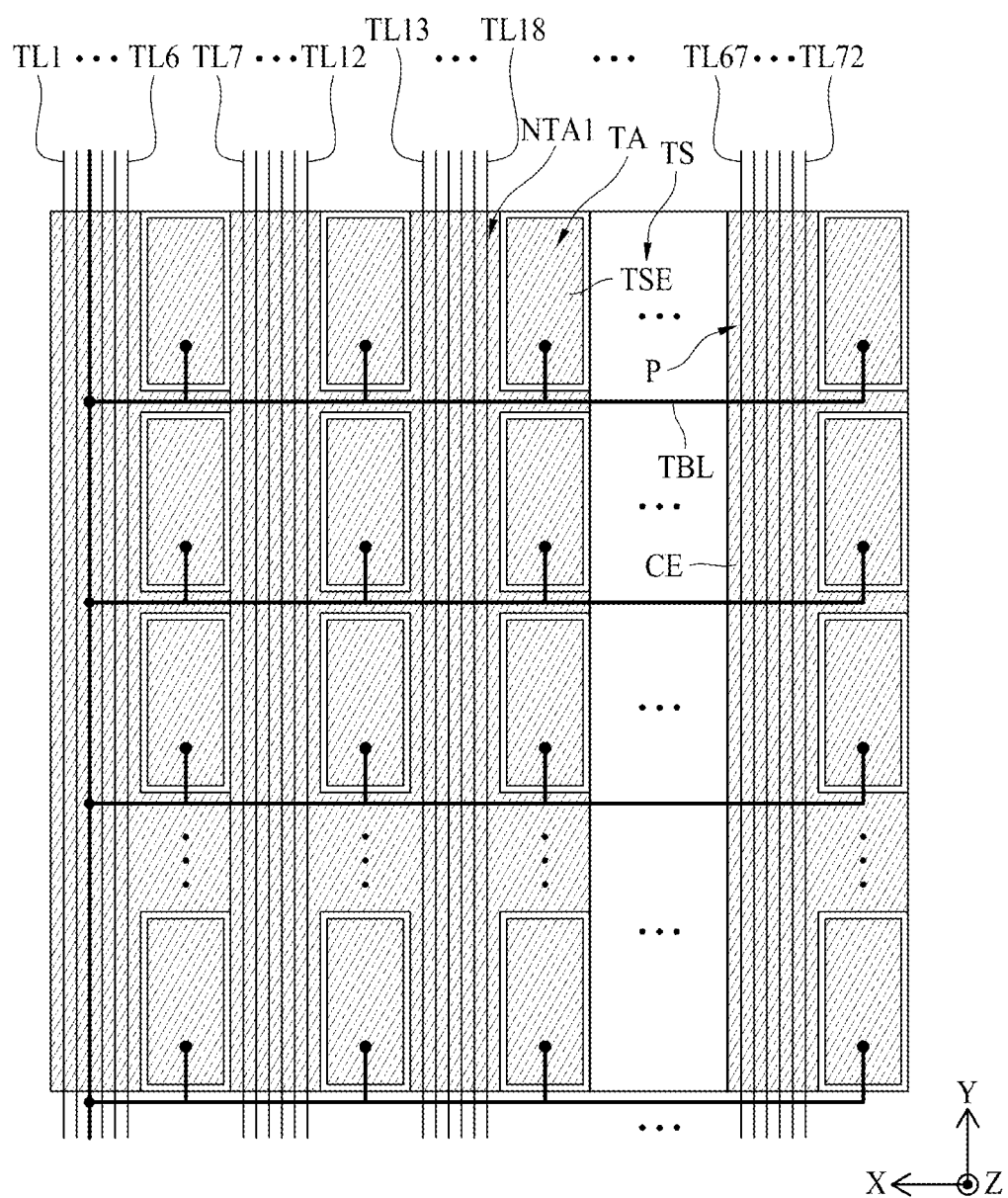
FIG. 5 is a view illustrating a connection relation between a plurality of touch lines and a plurality of touch sensors in one touch block.

FIG. 4 is a view illustrating a connection relation between a plurality of touch blocks and a plurality of touch lines, and FIG. 5 is a view illustrating a connection relation between a plurality of touch lines and a plurality of touch sensors in one touch block.

Referring to FIGS. 4 to 5, the transparent display panel 110 according to one embodiment of the present disclosure may include a plurality of touch blocks TB. Each of the plurality of touch blocks TB may include a plurality of pixels P and a plurality of transmissive areas TA disposed to correspond to the plurality of pixels P one-to-one as a basic unit for determining a user touch position. For example, each of the plurality of touch blocks TB may include 12×15 pixels P and 12×15 touch sensors TS. In this case, when image resolution is 1920×1080, touch resolution may be 160×72.

At this time, the touch sensor TS may include a touch sensor electrode TSE. The touch sensor electrode TSE may include the same material in the same layer as the cathode electrode CE of the pixel P. In this case, the touch sensor electrode TSE and the cathode electrode CE may be disposed to be spaced apart from each other.

In the transparent display panel 110 according to one embodiment of the present disclosure, as each of the plurality of touch lines TL is connected to one of the plurality of touch blocks TB, a change in capacitance of the touch sensors TS provided in the connected touch block TB may be sensed. That is, the plurality of touch lines TL provided in the transparent display panel 110 may correspond to the plurality of touch blocks TB one-to-one. Therefore, the number of touch lines TL may be the same as the number of touch blocks TB in the transparent display panel 110. For example, when the number of touch blocks TB is 160×72, the touch line TL may also be 160×72, and may be connected to the touch driver TIC.

As described above, in order to form the touch lines TL as much as the number of touch blocks TB, at least two touch lines TL can be provided in one first non-transmissive area NTA1. For example, when image resolution is 1920× 1080 and touch resolution is 160×72, six touch lines TL1, TL2, TL3, TL4, TL5 and TL6 may be provided in one first non-transmissive area NTA1, as shown in FIG. 3, in order to form 160×72 touch lines TL in the transparent display panel 110.

The plurality of touch sensors TS provided in one touch block TB may be connected to one of the plurality of touch lines TL provided in one touch block TB as shown in FIG. 5. For example, twelve first non-transmissive areas NTA1 may be provided in one touch block TB, and six touch lines TL1, TL2, TL3, TL4, TL5 and TL6 may be disposed in each of the twelve first non-transmissive areas NTA1. As a result, one touch block TB may be provided with 72 touch lines TL1, TL72. In this case, the plurality of touch sensors TS provided in one touch block TB may be connected to one specific touch line TL of the 72 touch lines TL1, TL72. At this time, the specific touch line TL may be connected to the plurality of touch sensors TS arranged in the second direction (e.g., X-axis direction) through the touch bridge lines TBL extended in the second direction (e.g., X-axis direction). As a result, the plurality of touch sensors TS provided in one touch block TB may be electrically connected through a specific touch line TL and the touch bridge lines TBL.

Each of the plurality of touch lines TL may correspond to touch blocks TB one-to-one. Therefore, the plurality of touch blocks TB are connected to different touch lines and thus may be electrically separated from each other. Each touch line TL may connect a plurality of touch sensors TS provided in a corresponding touch block TB to a touch driver TIC. In detail, each touch line TL may transmit the changed capacitance provided from the touch sensors TS provided in the touch block TB to the touch driver TIC. The touch driver TIC may sense the changed capacitance, and may determine a touch position of a user. Also, each touch line TL may provide the sensing voltage generated from the touch driver TIC to the touch sensors TS provided in the touch block TB.

Hereinafter, light emitting elements of a light emission area EA, the touch sensors TS of the transmissive area TA and a connection relation among the touch sensors and the touch bridge lines TBL will be described in more detail with reference to FIGS. 6 to 12.

Figure 6:
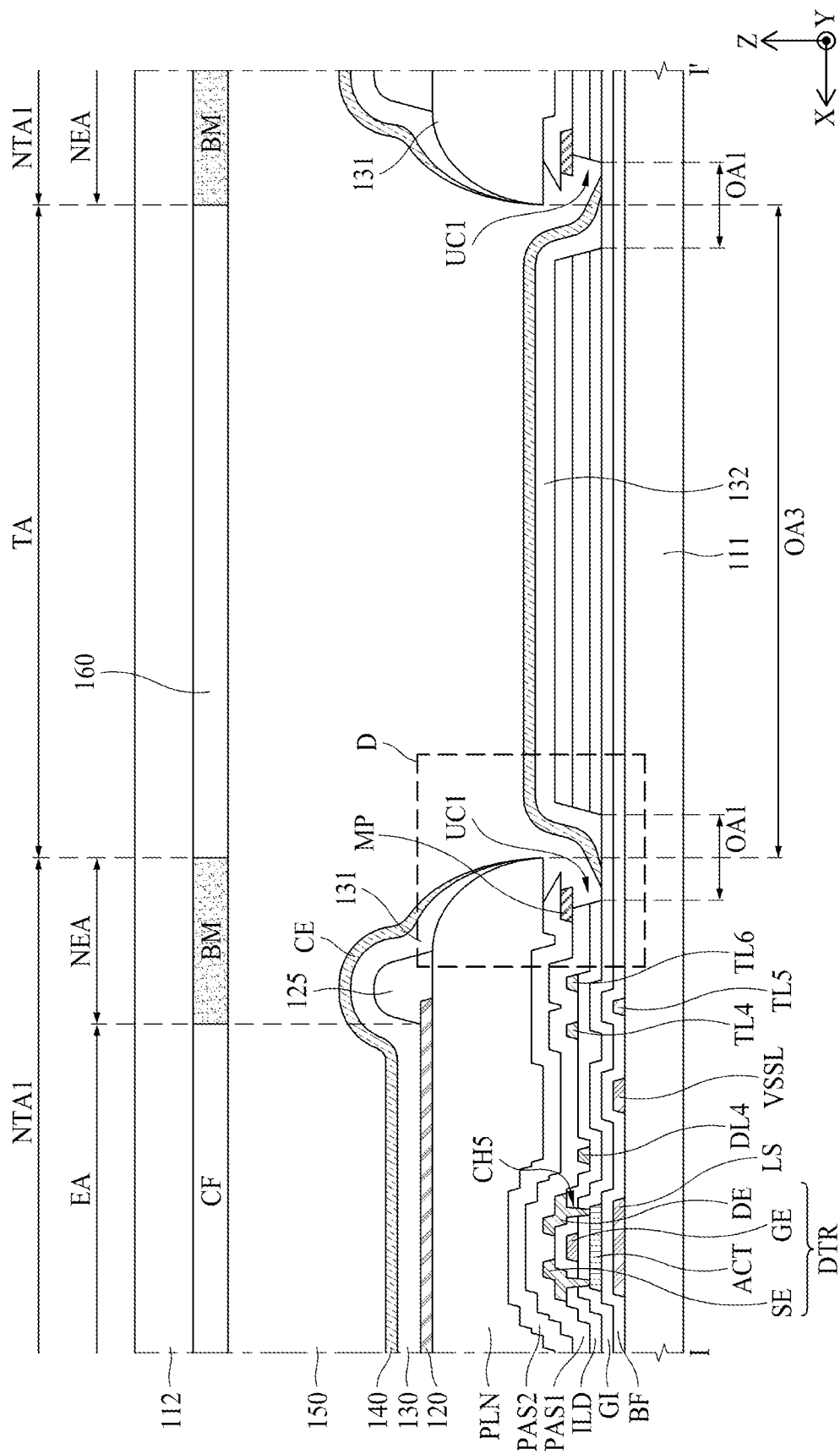
FIG. 6 is a cross-sectional view illustrating an example of line I-I' of FIG. 3.
Figure 7:
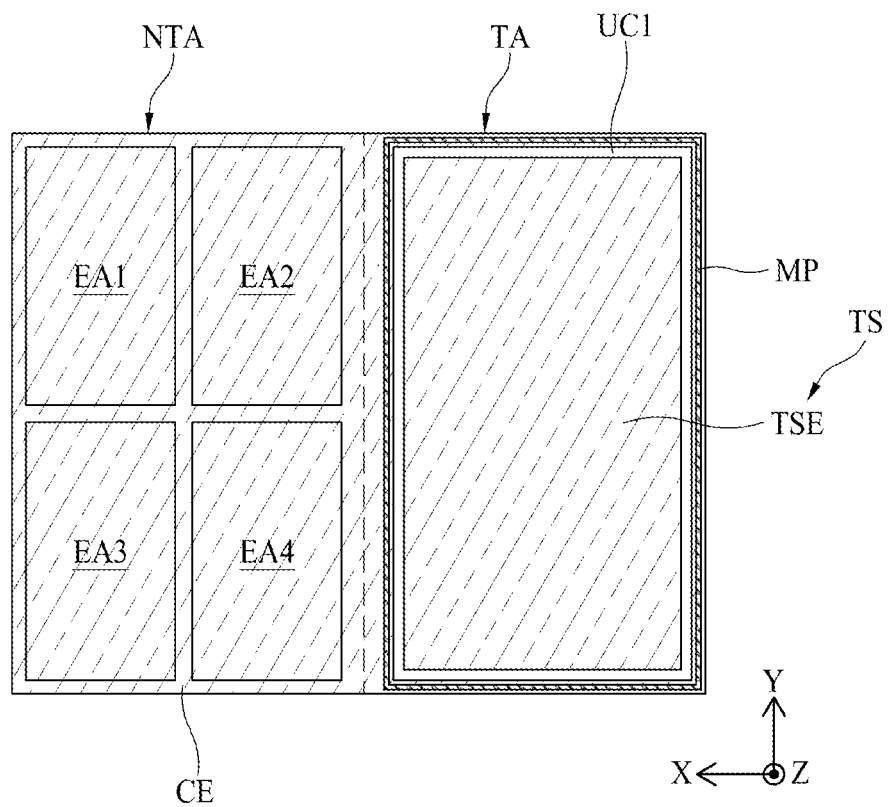
FIG. 7 is a view illustrating an example that a cathode electrode, a touch sensor electrode and a metal pattern are disposed.
Figure 8:
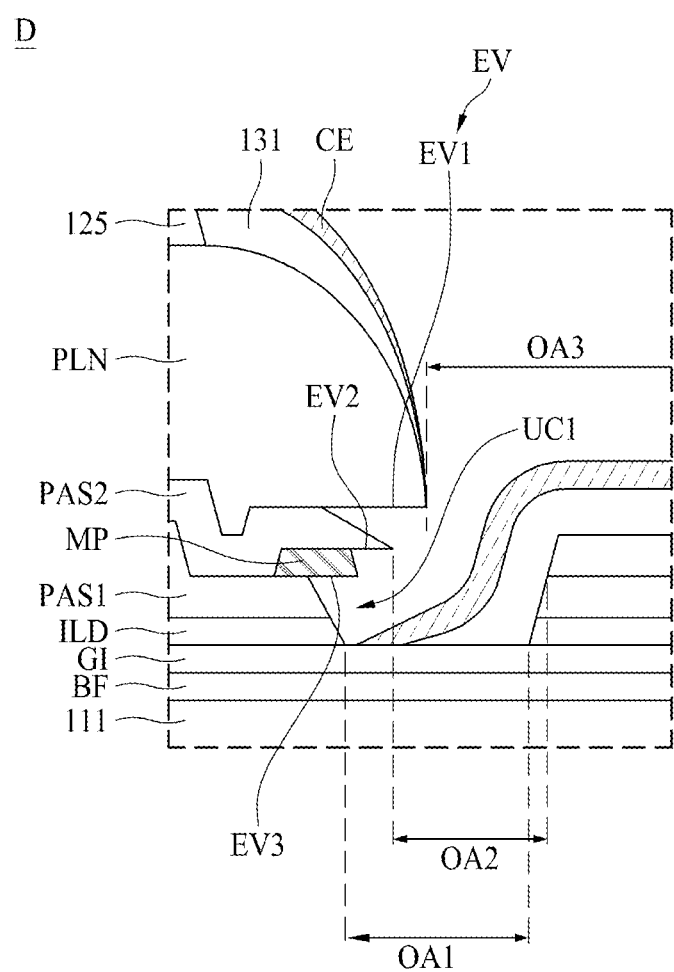
FIG. 8 is an enlarged view illustrating a first undercut structure provided in an area D of FIG. 6.

FIG. 6 is a cross-sectional view illustrating an example of line I-I' of FIG. 3, FIG. 7 is a view illustrating an example that a cathode electrode, a touch sensor electrode and a metal pattern are disposed, and FIG. 8 is an enlarged view illustrating a first undercut structure provided in an area D of FIG. 6.

Referring to FIGS. 3 and 6 to 8, a first non-transmissive area NTA1 includes circuit areas CA1, CA2, CA3 and CA4 in which at least one transistor and a capacitor are disposed, and may be provided with a pixel power line VDDL, a common power line VSSL, a reference line REFL, data lines DL and touch lines TL, which are extended in a first direction (Y-axis direction) and disposed so as not to overlap the circuit areas CA1, CA2, CA3 and CA4. The second non-transmissive area NTA2 may include a scan line SCANL extended in a second direction (X-axis direction) and a touch bridge line TBL.

At least one transistor may include a drive transistor DTR and switching transistors. The switching transistor may be switched in accordance with a scan signal supplied to a scan line SCANL to charge a data voltage supplied from the data line DL in the capacitor.

The driving transistor DTR is switched in accordance with the data voltage charged in the capacitor to generate a data current from a power source supplied from the pixel power line VDDL and supply the data current to a first electrode 120 of the subpixels SP1, SP2, SP3 and SP4. The driving transistor DTR may include an active layer ACT, a gate electrode GE, a source electrode SE, and a drain electrode DE.

As shown in FIG. 6, a light shielding layer LS may be provided over the first substrate 111. The light shielding layer LS may serve to shield external light incident on an active layer ACT in an area in which a driving transistor DTR is provided. The light shielding layer LS may include a single layer or multi-layer made of any one of molybdenum (Mo), aluminum (Al), chromium (Cr), gold (Au), titanium (Ti), nickel (Ni), neodymium (Nd) and copper (Cu), or their alloy.

The transparent display panel 110 according to one embodiment of the present disclosure may form at least one of the pixel power line VDDL, the common power line VSSL, the reference line REFL, the data lines DL and the touch lines TL in the same layer as the light shielding layer LS. For example, some of the reference line REFL, the common power line VSSL and the touch lines TL may include the same material as that of the light shielding layer LS and may be provided in the same layer as the light shielding layer LS, but are not limited thereto.

A buffer layer BF may be provided over the light shielding layer LS. The buffer layer BF is to protect the transistors DTR from water permeated through the first substrate 111 vulnerable to water permeation, and may include an inorganic layer, for example, a silicon oxide layer (SiOx), a silicon nitride layer (SiNx) or a multi-layer of the silicon oxide layer and the silicon nitride layer.

The active layer ACT of the driving transistor DTR may be provided over the buffer layer BF. The active layer ACT may include a silicon-based semiconductor material or an oxide-based semiconductor material.

A gate insulating layer GI may be provided over the active layer ACT of the driving transistor DTR. The gate insulating layer GI may be provided in the non-transmissive area NTA and the transmissive area TA. The gate insulating layer GI may include an inorganic layer, for example, a silicon oxide layer (SiOx), a silicon nitride layer (SiNx) or a multi-layer of the silicon oxide layer and the silicon nitride layer.

A gate electrode GE of the driving transistor DTR may be provided over the gate insulating layer GI. The gate electrode GE of the driving transistor DTR may include a single layer or multi-layer made of one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE of the driving transistor DTR. The interlayer dielectric layer ILD may be provided in the non-transmissive area NTA and the transmissive area TA. However, the interlayer dielectric layer ILD may be provided with a first opening area OA1, which exposes the gate insulating layer GI or the buffer layer BF along the edge of the transmissive area TA, to form a first undercut structure UC1 in the transmissive area TA. The interlayer dielectric layer ILD may include an inorganic layer, for example, a silicon oxide layer (SiOx), a silicon nitride layer (SiNx) or a multi-layer of the silicon oxide layer and the silicon nitride layer.

A source electrode SE and a drain electrode DE of the driving transistor DTR may be provided over the interlayer dielectric layer ILD. The source electrode SE and the drain electrode DE of the driving transistor DTR may be connected to the active layer ACT of the driving transistor DTR through a fifth contact hole CH5 passing through the gate insulating layer GI and the interlayer dielectric layer ILD. The source electrode SE and the drain electrode DE of the driving transistor DTR may include a single layer or multi-layer made of one of molybdenum (Mo), aluminum (Al), chromium (Cr), gold (Au), titanium (Ti), nickel (Ni), neodymium (Nd) and copper (Cu), or their alloy.

In the transparent display panel 110 according to one embodiment of the present disclosure, at least one of the pixel power line VDDL, the common power line VSSL, the reference line REFL, the data lines DL and the touch lines TL may be provided in the same layer as the source electrode SE and the drain electrode DE of the driving transistor DTR. For example, the pixel power line VDDL, the data lines DL and the touch lines TL may include the same material as that of the source electrode SE and the drain electrode DE in the same layer as the source electrode SE and the drain electrode DE, but are not limited thereto.

A first passivation layer PAS1 for insulating the driving transistor DTR may be provided over a source electrode SE and a drain electrode DE of the driving transistor DTR. The first passivation layer PAS1 may be provided in a non-transmissive area NTA and a transmissive area TA. However, the first passivation layer PAS1 may be provided with a first opening area OA1 formed to expose a gate insulating layer GI or a buffer layer BF along an edge of the transmissive area TA for the formation of a first undercut structure UC1. The first opening area OA1 of the first passivation layer PAS1 may at least partially overlap a first opening area OA1 of an interlayer dielectric layer ILD as shown in FIGS. 6 and 8, but is not limited thereto.

A second passivation layer PAS2 may be provided over the first passivation layer PAS1. The second passivation layer PAS2 may be provided in the non-transmissive area NTA and the transmissive area TA. However, in order to form the first undercut structure UC1, a second opening area OA2 may be formed along the edge of the transmissive area TA like the first opening area OA1 of the first passivation layer PAS1. At this time, the second opening area OA2 may overlap at least a portion of the first opening area OA1 of the first passivation layer PAS1.

The first and second passivation layers PAS1 and PAS2 may include an inorganic layer, for example, a silicon oxide layer (SiOx), a silicon nitride layer (SiNx) or a multi-layer thereof.

A planarization layer PLN may be provided over the second passivation layer PAS2 to planarize a step difference due to the driving transistor DTR and the plurality of signal lines. The planarization layer PLN may be provided in the non-transmissive area NTA. The planarization layer PLN may be provided with a third opening area OA3 that overlaps the transmissive area TA to form the first undercut structure UC1. At this time, the third opening area OA3 may overlap at least a portion of the first opening area OA1 of the first passivation layer PAS1 and at least a portion of the second opening area OA2 of the second passivation layer PAS2. Also, the third opening area OA3 may fully overlap a touch sensor TS.

The planarization layer PLN may include an organic layer such as an acrylic resin, an epoxy resin, a phenolic resin, a polyamide resin and a polyimide resin.

The transparent display panel 110 according to one embodiment of the present disclosure may form a first undercut structure UC1 by using a planarization layer PLN and a plurality of inorganic insulating layers, for example, the first and second passivation layers PAS1 and PAS2 and the interlayer dielectric layer ILD. In detail, the first undercut structure UC1 may include a plurality of eaves EV. The first undercut structure UC1 may include a first eave EV1 of the planarization layer PLN and a second eave EV2 of the second passivation layer PAS2.

In one embodiment, the transparent display panel 110 may further include a metal pattern MP to increase the number of eaves EV in the first undercut structure UC1. The metal pattern MP may be provided between the first passivation layer PAS1 and the second passivation layer PAS2. The metal pattern MP may be provided along the edge of the transmissive area TA, and may have a planar closed shape as shown in FIG. 7. The metal pattern MP is provided to form the first undercut structure UC1, and may be electrically floated. That is, the metal pattern MP may not be electrically connected to other signal lines.

In this way, when the metal pattern MP is provided between the first passivation layer PAS1 and the second passivation layer PAS2, the first undercut structure UC1 may further include a third eave EV3 of the metal pattern MP.

The first eave EV1 may be formed in such a manner that the planarization layer PLN is more protruded than a plurality of inorganic insulating layers, for example, the first passivation layer PAS1, the second passivation layer PAS2, the interlayer dielectric layer ILD and the metal pattern MP in a direction of the transmissive area TA. At this time, the first eave EV1 may overlap at least a portion of the first opening area OA1 of the first passivation layer PAS1 and at least a portion of the second opening area OA2 of the second passivation layer PAS2.

Therefore, the first undercut structure UC1 may expose at least a portion of a lower surface of the planarization layer PLN. The first undercut structure UC1 may not include a plurality of inorganic insulating layers, for example, the first passivation layer PAS1, the second passivation layer PAS2, the interlayer dielectric layer ILD and the metal pattern MP below the exposed lower surface, and may form a gap space with the gate insulating layer GI or the buffer layer BF.

The first eave EV1 may be formed through a first wet etching process. For example, the first wet etching process may be Buffered Oxide Etch (BOE), and may be isotropic etching in view of characteristics. In the transparent display panel 110 according to one embodiment of the present disclosure, the first wet etching process may be performed for the second passivation layer PAS2, so that the second passivation layer PAS2 provided below the edge area of the planarization layer PLN is etched, whereby a lower surface of the planarization layer PLN may be etched.

The second eave EV2 may be formed in such a manner that the second passivation layer PAS2 is more protruded than some of a plurality of inorganic insulating layers, for example, the first passivation layer PAS1, the interlayer dielectric layer ILD and the metal pattern MP in a direction of the transmissive area TA. At this time, the second eave EV2 may overlap at least a portion of the first opening area OA1 of the first passivation layer PAS1. At this time, the second opening area OA2 of the second passivation layer PAS2 may have a width smaller than that of the first opening area OA1 of the first passivation layer PAS1.

Therefore, the first undercut structure UC1 may expose at least a portion of a lower surface of the second passivation layer PAS2. The first undercut structure UC1 may not include some of a plurality of inorganic insulating layers, for example, the first passivation layer PAS1, the interlayer dielectric layer ILD and the metal pattern MP below the exposed lower surface, and may form a gap space with the gate insulating layer GI or the buffer layer BF.

The second eave EV2 may be formed through a second wet etching process. The second wet etching process may be isotropic etching in view of characteristics. In the transparent display panel 110 according to one embodiment of the present disclosure, the second wet etching process may be performed for the metal pattern MP, so that the metal pattern MP provided below the edge area of the second passivation layer PAS2 is etched, whereby a lower surface of the second passivation layer PAS2 may be etched.

The third eave EV3 may be formed in such a manner that the metal pattern MP is more protruded than some of a plurality of inorganic insulating layers, for example, the first passivation layer PAS1 and the interlayer dielectric layer ILD in a direction of the transmissive area TA. At this time, the third eave EV3 may overlap at least a portion of the first opening area OA1 of the first passivation layer PAS1. Therefore, the first undercut structure UC1 may expose at least a portion of a lower surface of the metal patter MP. The first undercut structure UC1 may not include some of a plurality of inorganic insulating layers, for example, the first passivation layer PAS1 and the interlayer dielectric layer ILD below the exposed lower surface, and may form a gap space with the gate insulating layer GI or the buffer layer BF.

The third eave EV3 may be formed through a third wet etching process. The third wet etching process may be BOE, and may be isotropic etching in view of characteristics. In the transparent display panel 110 according to one embodiment of the present disclosure, the third wet etching process may be performed for the first passivation layer PAS1, so that the first passivation layer PAS1 provided below the edge area of the metal pattern MP is etched, whereby a lower surface of the metal pattern MP may be exposed.

The first undercut structure UC1 is provided inside the transmissive area TA, and may have a planar closed shape. For example, the first undercut structure UC1 may be provided along the edge of the transmissive area TA as shown in FIG. 7. At this time, the first undercut structure UC1 may be provided to surround the touch sensor TS.

In the transparent display panel 110 according to one embodiment of the present disclosure, the first undercut structure UC1 may be formed using the planarization layer PLN and the plurality of inorganic insulating layers, so that light transmittance may be less reduced due to the first undercut structure UC1.

A first electrode 120, an organic light emitting layer 130, a second electrode 140 and a bank 125 may be provided over the planarization layer PLN1.

The first electrode 120 may be provided for each of subpixels SP1, SP2, SP3 and SP4 over the planarization layer PLN. The first electrode 120 is not provided in the transmissive area TA. The first electrode 120 may be connected to the driving transistor DTR. In detail, the first electrode 120 may be connected to one of the source electrode SE and the drain electrode DE of the driving transistor DTR through a contact hole (not shown) passing through the planarization layer PLN and the first and second passivation layers PAS1 and PAS2.

The first electrode 120 may include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti). The first electrode 120 may be an anode electrode.

The bank 125 may be provided over the planarization layer PLN. The bank 125 may be provided to at least partially cover an edge of the first electrode 120 and expose a portion of the first electrode 120. Therefore, the bank 125 may solve a problem in which light emitting efficiency is deteriorated due to concentration of a current on an end of the first electrode 120.

The bank 125 may define light emission areas EA1, EA2, EA3 and EA4 of the subpixels SP1, SP2, SP3 and SP4. The light emission areas EA1, EA2, EA3 and EA4 of the subpixels SP1, SP2, SP3 and SP4 represent areas in which the first electrode 120, the light emitting layer 130 and a cathode electrode CE are sequentially stacked so that holes from the first electrode 120 and electrons from the cathode electrode CE are combined with each other in the light emitting layer 130 to emit light. In this case, the area in which the bank 125 is provided may become the non-light emission area NEA because light is not emitted therefrom, and the area in which the bank 125 is not provided and the first electrode is exposed may become the light emission area EA. The bank 125 may include an organic layer such as an acrylic resin, an epoxy resin, a phenolic resin, a polyamide resin, and a polyimide resin.

The organic light emitting layer 130 may be provided over the first electrode 120. The organic light emitting layer 130 may include a hole transporting layer, a light emitting layer and an electron transporting layer. In this case, when a voltage is applied to the first electrode 120 and the cathode electrode CE, holes and electrons move to the light emitting layer through the hole transporting layer and the electron transporting layer, respectively, and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, the light emitting layer of the organic light emitting layer 130 may be provided for each of the subpixels SP1, SP2, SP3 and SP4. For example, a green light emitting layer for emitting green light may be provided in the first subpixel SP1, a red light emitting layer for emitting red light may be provided in the second subpixel SP2, a blue light emitting layer for emitting blue light may be provided in the third subpixel SP3, and a white light emitting layer for emitting white light may be provided in the fourth subpixel SP4. In this case, the light emitting layer of the organic light emitting layer 130 is not provided in the transmissive area TA.

The organic light emitting layer 130 may be separated without being continuous between the non-transmissive area NTA and the transmissive area TA by the first undercut structure UC1. In detail, the organic light emitting layer 130 may be divided into an organic light emitting layer 131 provided in the non-transmissive area NTA, and an organic light emitting layer 132 provided in the transmissive area TA by the first undercut structure UC1. That is, the organic light emitting layer 131 of the organic light emitting layer 130, which is provided in the non-transmissive area NTA, and the organic light emitting layer 132 of the organic light emitting layer 130, which is provided in the transmissive area TA, may be spaced apart from each other by the first undercut structure UC1.

The second electrode 140 may be provided over the organic light emitting layer 130 and the bank 125. When the second electrode 140 is deposited on the entire surface, the second electrode 140 may be separated without being continuous between the non-transmissive area NTA and the transmissive area TA by the first undercut structure UC1. In detail, the second electrode 140 may be divided into a second electrode CE provided in the non-transmissive area NTA, and a second electrode TSE provided in the transmissive area TA by the first undercut structure UC1.

The second electrode CE provided in the non-transmissive area NTA may be the cathode electrode CE, and may be an element constituting the light emitting element. The cathode electrode CE may be connected to a cathode contact portion CCT to receive a power source from the common power line VSSL. The cathode electrode CE may be a common layer that is commonly provided in the subpixels SP1, SP2, SP3 and SP4 to apply the same voltage to the subpixels.

The second electrode 140 provided in the transmissive area TA may be a touch sensor electrode TSE, and may be an element constituting the touch sensor TS. An end of the touch sensor electrode TSE may be disposed below the first eave EV1 and the second eave EV2 of the first undercut structure UC1. The touch sensor electrode TSE may be connected to a touch contact electrode TCT to provide a change in capacitance to a touch line TL.

The second electrode 140, which includes the cathode electrode CE and the touch sensor electrode TSE, may include a transparent conductive material (TCO) such as ITO and IZO, which may transmit light, or a semi-transmissive conductive material such as magnesium (Mg), silver (Ag) or an alloy of magnesium (Mg) and silver (Ag). When the second electrode 140 include a semi-transmissive conductive material, light emitting efficiency may be increased by a micro cavity.

An encapsulation layer 150 may be provided over the light emitting elements and the touch sensors TS. The encapsulation layer 150 may be provided over the cathode electrode CE and the touch sensor electrode TSE to at least partially cover the cathode electrode CE and the touch sensor electrode TSE.

The encapsulation layer 150 serves to prevent oxygen or water from being permeated into the organic light emitting layer 130, the cathode electrode CE and the touch sensor electrode TSE. Accordingly, in some embodiments, the encapsulation layer 150 may include at least one inorganic layer and at least one organic layer.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels SP1, SP2, SP3 and SP4. A black matrix BM may be provided between color filters CF. The black matrix BM may be disposed between the subpixels SP1, SP2, SP3 and SP4 to prevent a color mixture from occurring between adjacent subpixels SP1, SP2, SP3 and SP4. In addition, the black matrix BM may prevent light incident from the outside from being reflected by the plurality of lines, for example, the scan lines SCANL, the pixel power line VDDL, the common power line VSSL, the reference line REFL, data lines DL, etc., provided between the subpixels SP1, SP2, SP3 and SP4.

In the transparent display panel 110 according to one embodiment of the present disclosure, the touch sensor electrode TSE of the touch sensor TS and the cathode electrode CE of the light emitting element may be formed in the same layer by the first undercut structure UC1. The transparent display panel 110 according to one embodiment of the present disclosure has a simple touch process and does not need to add a separate mask for the touch sensor electrode TSE.

Also, in the transparent display panel 110 according to one embodiment of the present disclosure, the first undercut structure UC1 includes a plurality of eaves EV, so that short-circuit may be prevented from occurring between the touch sensor electrode TSE of the touch sensor TS and the cathode electrode CE of the light emitting element. Since the touch sensor electrode TSE of the touch sensor TS and the cathode electrode CE of the light emitting element are simultaneously deposited on the same layer, the touch sensor electrode TSE of the touch sensor TS and the cathode electrode CE of the light emitting element may be connected to each other without being separated from each other, whereby a defect may occur. When a plurality of first undercut structures UC1 are provided, a short defect between the touch sensor electrode TSE of the touch sensor TS and the cathode electrode CE of the light emitting element may be reduced. However, when the plurality of first undercut structures UC1 are provided, the touch sensor electrode TSE of the touch sensor TS and the cathode electrode CE of the light emitting element may be effectively separated from each other, but a size of the touch sensor TS may be reduced to deteriorate touch performance.

In the transparent display panel 110 according to one embodiment of the present disclosure, two or more eaves EV are formed in one first undercut structure UC1, so that the touch sensor electrode TSE of the touch sensor TS and the cathode electrode CE of the light emitting element may be separated from each other. Therefore, in the transparent display panel 110 according to one embodiment of the present disclosure, a short defect between the touch sensor electrode TSE of the touch sensor TS and the cathode electrode CE of the light emitting element may be reduced without reducing a size of the touch sensor TS.

Also, in the transparent display panel 110 according to one embodiment of the present disclosure, the first undercut structure UC1 is formed using the planarization layer PLN and the plurality of inorganic insulating layers, so that loss of light transmittance due to the first undercut structure UC1 may be reduced or minimized.

Also, in the transparent display panel 110 according to one embodiment of the present disclosure, the touch lines TL are disposed below the light emitting element, so that light emitting efficiency of the pixel P may be prevented from being deteriorated due to the touch lines TL.

Also, in the transparent display panel 110 according to one embodiment of the present disclosure, the touch lines TL are disposed so as not to overlap the circuit areas CA1, CA2, CA3 and CA4, whereby influence due to the circuit elements may be reduced or minimized and at the same time uniformity of parasitic capacitance may be improved.

Also, in the transparent display panel 110 according to one embodiment of the present disclosure, the plurality of touch lines TL are disposed in the first non-transmissive area NTA1, and only one touch bridge line TBL for connecting the plurality of touch sensors TS is provided in the second non-transmissive area NTA2, so that a size decrease of the transmissive area TA or decrease of light transmittance due to the plurality of touch lines TL and the touch bridge line TBL may be reduced or minimized.

The plurality of touch sensors TS included in one touch block TB may be connected to the touch line TL through the bridge line TBL. In the transparent display panel 110 according to one embodiment of the present disclosure, a touch connection portion TC may be provided between the touch sensor TS and the bridge line TBL to connect the touch sensor TS with the bridge line TBL.

Hereinafter, the touch connection portion TC will be described in detail with reference to FIGS. 9 to 12.

Figure 9:
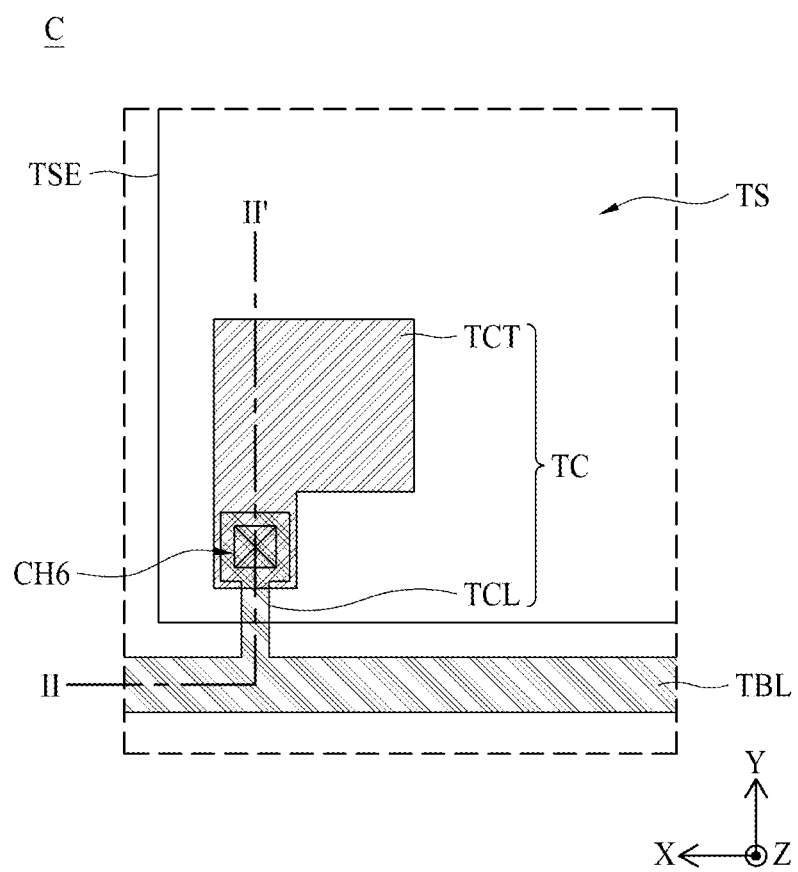
FIG. 9 is an enlarged view illustrating an example of an area C of FIG. 3.
Figure 10:
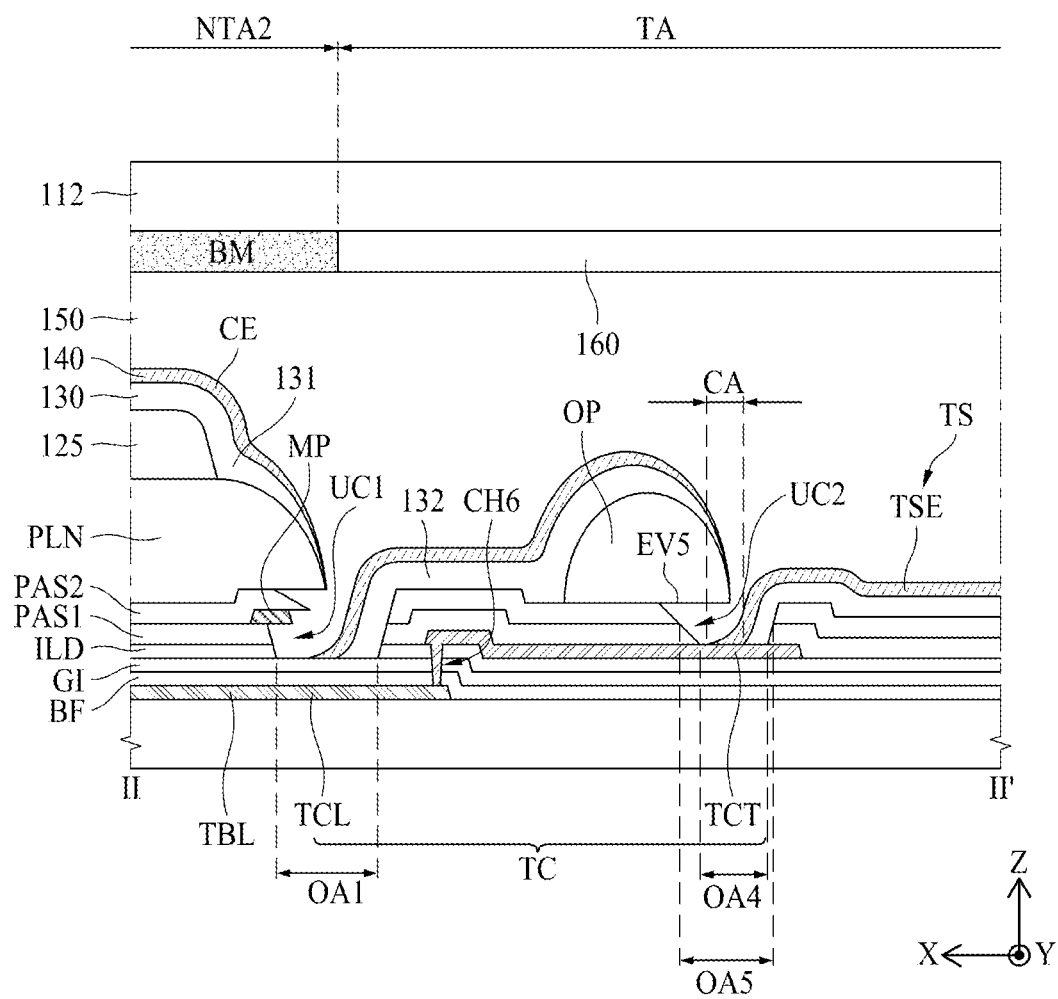
FIG. 10 is a cross-sectional view illustrating an example of line II-IP of FIG. 9.
Figure 11:
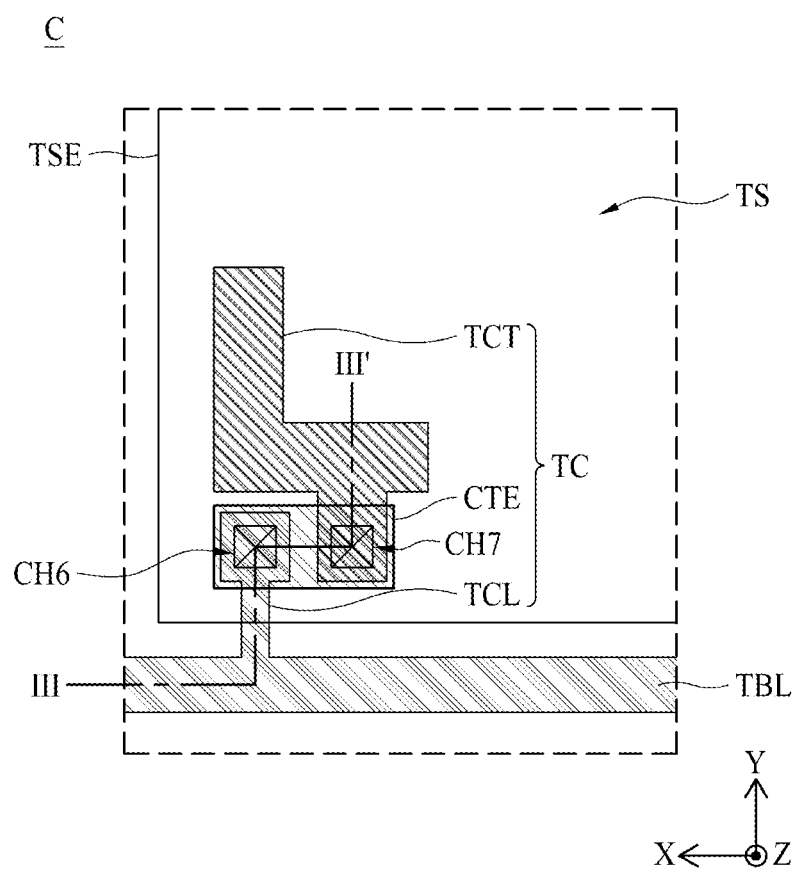
FIG. 11 is an enlarged view illustrating another example of an area C of FIG. 3.
Figure 12:
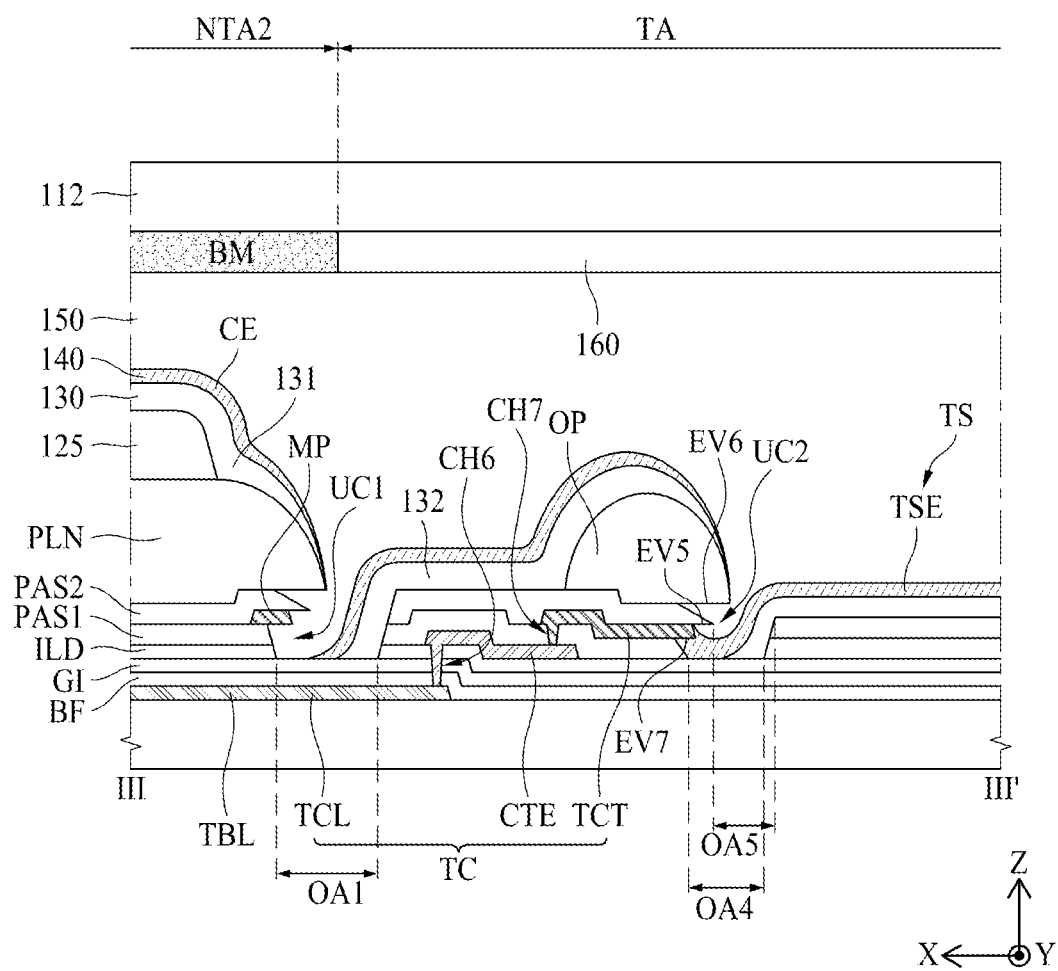
FIG. 12 is a cross-sectional view illustrating an example of line III-III' of FIG. 11.

FIG. 9 is an enlarged view illustrating an example of an area C of FIG. 3, FIG. 10 is a cross-sectional view illustrating an example of line II-IF of FIG. 9, FIG. 11 is an enlarged view illustrating another example of an area C of FIG. 3, and FIG. 12 is a cross-sectional view illustrating an example of line III-III' of FIG. 11.

Referring to FIGS. 3 and 9 to 12, each of the plurality of touch sensors TS may be connected to the touch bridge line TBL through the touch connection portion TC. The touch connection portion TC may at least partially overlap the touch sensor TS at one end and at least partially overlap the touch bridge line TBL at the other end to connect the touch sensor TS with the touch bridge line TBL. The touch connection portion TC may include a touch connection line TCL and a touch contact electrode TCT as shown in FIGS. 9 and 10.

The touch connection line TCL may connect the touch bridge line TBL with the touch sensor TS. In detail, the touch connection line TCL may have one end connected to the touch bridge line TBL and the other end connected to the touch contact electrode TCT through a sixth contact hole CH6. The touch connection line TCL may be connected to the touch sensor TS through the touch contact electrode TCT.

The touch connection line TCL may be formed in a layer provided between the first substrate 111 and the driving transistor DTR. In one embodiment, the touch connection line TCL may be formed of the same material in the same layer as the light shielding layer LS. The touch connection line TCL may be extended across the first undercut structure UC1. The first undercut structure UC1 may be formed through wet etching processes. In the transparent display panel 110 according to one embodiment of the present disclosure, the touch connection line TCL may be formed on the same layer as the light shielding layer LS so that the touch connection line TCL may be prevented from being lost in the wet etching processes for forming the first undercut structure UC1.

The touch contact electrode TCT may be provided in the transmissive area TA. The touch contact electrode TCT may be disposed between the touch connection line TCL and the touch sensor electrode TSE to electrically connect the touch connection line TCL with the touch sensor electrode TSE. The touch contact electrode TCT may be connected to the touch connection line TCL through the sixth contact hole CH6.

In addition, at least a portion of an upper surface of the touch contact electrode TCT may be exposed by a second undercut structure UC2, and the touch sensor electrode TSE may be connected to the exposed upper surface of the touch contact electrode TCT. In detail, the touch contact electrode TCT may be formed in a layer provided between the buffer layer BF and the second passivation layer PAS2. In one embodiment, the touch contact electrode TCT may be provided between the interlayer dielectric layer ILD and the first passivation layer PAS1. That is, the touch contact electrode TCT may be formed in the same layer as the source electrode SE and the drain electrode DE of the driving transistor DTR.

In this case, the first passivation layer PAS1 may be provided with a fourth opening area OA4 formed to expose at least a portion of the upper surface of the touch contact electrode TCT. The second passivation layer PAS2 may be provided with a fifth opening area OA5 formed to overlap at least a portion of the fourth opening area OA4 of the first passivation layer PAS1. Therefore, the upper surface of the touch contact electrode TCT may be exposed by the fourth opening area OA4 of the first passivation layer PAS1 and the fifth opening area OA5 of the second passivation layer PAS2.

Meanwhile, in the transparent display panel 110 according to one embodiment of the present disclosure, an organic pattern OP may be formed to form the second undercut structure UC2. The organic pattern OP may be provided over the second passivation layer PAS2 in the transmissive area TA. The organic pattern OP may be formed on the same layer as the planarization layer PLN, and may be made of the same material as that of the planarization layer PLN.

The second undercut structure UC2 may be formed such that the organic pattern OP is provided to overlap at least a portion of the fourth opening area OA4 of the first passivation layer PAS1 and at least a portion of the fifth opening area OA5 of the second passivation layer PAS2. The second undercut structure UC2 may include a fifth eave EV5.

The fifth eave EA5 may be formed in such a manner that an end of the organic pattern OP is more protruded than the first passivation layer PAS1 in the fourth opening area OA4 or more protruded than the second passivation layer PAS2 in the fifth opening area OA5. The fifth eave EV5 may be formed through the first wet etching process for forming the first eave EV1 of the first undercut structure UC1 and the third wet etch process for forming the third eave EV3 of the first undercut structure UC1.

Therefore, the second undercut structure UC2 may expose at least a portion of a lower surface of the organic pattern OP. The second undercut structure UC2 is not provided with the first passivation layer PAS1 and the second passivation layer PAS2 below the exposed lower surface, and may form a gap space with the touch contact electrode TCT.

The second undercut structure UC2 may be provided inside the area where the first undercut structure UC1 is formed. That is, the second undercut structure UC2 may be disposed inside the area in which the touch sensor TS is provided.

The touch sensor electrode TSE may be deposited on the exposed upper surface of the touch contact electrode TCT to form a contact area CA. The touch sensor electrode TSE may be disconnected without being continuously connected on the organic pattern OP by the second undercut structure UC2. The touch sensor electrode TSE may be in contact with the upper surface of the touch contact electrode TCT, which is exposed by the gap space between the lower surface of the organic pattern OP and the touch contact electrode TCT.

Therefore, the touch sensor electrode TSE may be electrically connected to the touch contact electrode TCT. The touch contact electrode TCT may transfer a change in capacitance of the touch sensor electrode TSE to the touch line TL through the touch connection line TCL and the touch bridge line TBL.

In the transparent display panel 110 according to one embodiment of the present disclosure, the second undercut structure UC2 is formed using the planarization layer PLN and the plurality of inorganic insulating layers, so that loss of light transmittance due to the second undercut structure UC2 may be reduced or minimized In FIG. 9 and FIG. 10, the touch contact electrode TCT is provided in the same layer as the source electrode SE and the drain electrode DE of the driving transistor DTR and its upper surface is in contact with the touch sensor electrode TSE, but is not limited thereto.

In another embodiment, the touch contact electrode TCT may be provided between the first passivation layer PAS1 and the second passivation layer PAS2 as shown in FIGS. 11 and 12.

In detail, the touch connection portion TC shown in FIGS. 11 and 12 may include a touch connection line TCL, a connection electrode CTE and a touch contact electrode TCT.

The touch connection line TCL may be disposed between the touch bridge line TBL and the touch sensor TS to connect the touch bridge line TBL with the touch sensor TS. In detail, the touch connection line TCL may have one end connected to the touch bridge line TBL and the other end connected to the connection electrode CTE through the sixth contact hole CH6. The touch connection line TCL may be connected to the touch sensor electrode TSE through the connection electrode CTE and the touch contact electrode TCT.

The touch connection line TCL may be formed in a layer provided between the first substrate 111 and the driving transistor DTR. In one embodiment, the touch connection line TCL may be formed of the same material in the same layer as the light shielding layer LS.

The connection electrode CTE may be provided in the transmissive area TA to connect the touch connection line TCL with the connection electrode CTE. One end of the connection electrode CTE may be connected to the touch connection line TCL through the sixth contact hole CH6, and the other end thereof may be connected to the touch contact electrode TCT through a seventh contact hole CH7. The connection electrode CTE may be disposed between the interlayer dielectric layer ILD and the first passivation layer PAS1. That is, the connection electrode CTE may be formed on the same layer as the source electrode SE and the drain electrode DE of the driving transistor DTR.

In FIG. 11 and FIG. 12, the touch contact electrode TCT is shown as being connected to the touch connection line TCL through the connection electrode CTE, but is not limited thereto. In another embodiment, the touch contact electrode TCT may be directly connected to the touch connection line TCL.

The touch contact electrode TCT may be provided in the transmissive area TA. The touch contact electrode TCT may be disposed between the connection electrode CTE and the touch sensor electrode TSE to electrically connect the touch connection line TCL with the touch sensor electrode TSE. The touch contact electrode TCT may be connected to the connection electrode CTE through the seventh contact hole CH7, and may be electrically connected to the touch connection line TCL through the connection electrode CTE.

In addition, a side of the touch contact electrode TCT may be exposed by the second undercut structure UC2, and the touch sensor electrode TSE may be connected to the exposed side. In detail, the touch contact electrode TCT may be formed in a layer provided between the buffer layer BF and the second passivation layer PAS2. In one embodiment, the touch contact electrode TCT may be provided between the first passivation layer PAS1 and the second passivation layer PAS2. That is, the touch contact electrode TCT may be provided in the same layer as the metal pattern MP of the first undercut structure UC1.

In this case, the first passivation layer PAS1 may be provided with a fourth opening area OA4 formed to expose at least a portion of the upper surface of the interlayer dielectric layer ILD. The second passivation layer PAS2 may be provided with a fifth opening area OA5 formed to overlap at least a portion of the fourth opening area OA4 of the first passivation layer PAS1. The side of the touch contact electrode TCT may be exposed through the fourth opening area OA4 of the first passivation layer PAS1 and the fifth opening area OA5 of the second passivation layer PAS2 between the first passivation layer PAS1 and the second passivation layer PAS2.

In one embodiment, the touch contact electrode TCT may be provided to overlap at least a portion of the fourth opening area OA4 of the first passivation layer PAS1. In this case, at least a portion of the lower surface of the touch contact electrode TCT may be exposed.

Meanwhile, the organic pattern OP may be provided over the second passivation layer PAS2 in the transmissive area TA. The organic pattern OP may be formed on the same layer as the planarization layer PLN, and may be made of the same material as that of the planarization layer PLN.

The second undercut structure UC2 shown in FIGS. 11 and 12 may include a plurality of eaves EV. In detail, the second undercut structure UC2 may include a fifth eave EV5 of the organic pattern OP and a sixth eave EV6 of the second passivation layer PAS2. In one embodiment, the second undercut structure UC2 may further include a seventh eave EV7 of the touch contact electrode TCT.

The fifth eave EV5 may be formed in such a manner that an end of the organic pattern OP is more protruded than the first passivation layer PAS1 in the fourth opening area OA4 or more protruded than the second passivation layer PAS2 in the fifth opening area OA5. The fifth eave EV5 may be formed through the first wet etching process for forming the first eave EV1 of the first undercut structure UC1.

Therefore, the second undercut structure UC2 may expose at least a portion of the lower surface of the organic pattern OP. The second undercut structure UC2 may not include the first passivation layer PAS1, the second passivation layer PAS2 and the touch contact electrode TCT below the exposed lower surface, and may form a gap space with the interlayer dielectric layer ILD.

The sixth eave EV6 may be formed in such a manner that an end of the second passivation layer PAS2 is more protruded than the touch contact electrode TCT or the first passivation layer PAS1 in the fourth opening area OA4. The sixth eave EV6 may be formed through the second wet etching process for the second eave EV2 of the first undercut structure UC1.

Therefore, the second undercut structure UC2 may expose at least a portion of the lower surface of the second passivation layer PAS2. The second undercut structure UC2 may not include the first passivation layer PAS1 and the touch contact electrode TCT below the exposed lower surface, and may form a gap space with the interlayer dielectric layer ILD.

The seventh eave EV7 may be formed in such a manner that an end of the touch contact electrode TCT is more protruded than the first passivation layer PAS1 in the fourth opening area OA4. The seventh eave EV7 may be formed through the third wet etching process for forming the third eave EV3 of the first undercut structure UC1.

Therefore, the second undercut structure UC2 may expose the side of the touch contact electrode TCT. In one embodiment, the second undercut structure UC2 may expose at least a portion of the lower surface of the touch contact electrode TCT. The second undercut structure UC2 may not include the first passivation layer PAS1 below the exposed lower surface, and may form a gap space with the interlayer dielectric layer ILD.

The second undercut structure UC2 may be provided inside the area where the first undercut structure UC1 is formed. That is, the second undercut structure UC2 may be disposed inside the area in which the touch sensor TS is provided.

The touch sensor electrode TSE may be deposited on the exposed side of the touch contact electrode TCT to form a contact area CA. In one embodiment, the touch sensor electrode TSE may be also deposited on the lower surface of the touch contact electrode TCT.

The touch sensor electrode TSE may be disconnected without being continuously connected on the organic pattern OP by the second undercut structure UC2. The touch sensor electrode TSE may be in contact with the side or the lower surface of the touch contact electrode TCT, which is exposed by the gap space between the lower surface of the organic pattern OP and the interlayer dielectric layer ILD.

Therefore, the touch sensor electrode TSE may be electrically connected to the touch contact electrode TCT. The touch contact electrode TCT may transfer a change in capacitance of the touch sensor electrode TSE to the touch line TL through the touch connection line TCL and the touch bridge line TBL.

The transparent display panel 110 shown in FIGS. 11 and 12 is different from the transparent display panel 110 shown in FIGS. 9 and 10 in that the touch sensor electrode TSE is in contact with the side or the lower surface of the touch contact electrode TCT. In the transparent display panel 110 shown in FIGS. 11 and 12, since the upper surface of the touch contact electrode TCT does not need to be exposed, the touch contact electrode TCT does not need to be formed to have a wide area as shown in FIG. 9. Therefore, the transparent display panel 110 shown in FIGS. 11 and 12 may reduce the area of the touch contact electrode TCT in comparison with the transparent display panel 110 shown in FIGS. 9 and 10. Since the touch contact electrode TCT is made of an opaque metal material or a semi-transparent metal material, the transparent display panel 110 shown in FIGS. 11 and 12 may reduce loss of light transmittance due to the touch contact electrode TCT. That is, the transparent display panel 110 shown in FIGS. 11 and 12 may improve light transmittance of the transmissive area TA in comparison with the transparent display panel 110 shown in FIGS. 9 and 10.

Also, in the transparent display panel 110 shown in FIGS. 11 and 12, the touch sensor electrode 110 may be in contact with the lower surface of the touch sensor electrode TSE as well as the side of the touch sensor electrode TSE. Therefore, the transparent display panel 110 shown in FIGS. 11 and 12 may sufficiently make sure of a contact area between the touch sensor electrode TSE and the touch contact electrode TCT even though a planar area of the touch sensor electrode TSE is reduced.

The first undercut structure UC1 shown in FIGS. 6 to 8 includes the metal pattern MP, but is not limited thereto. The first undercut structure UC1 may form a plurality of eaves EV even without including the metal pattern MP. Hereinafter, another example of the first undercut structure will be described with reference to FIGS. 13 to 17G.

Figure 13:
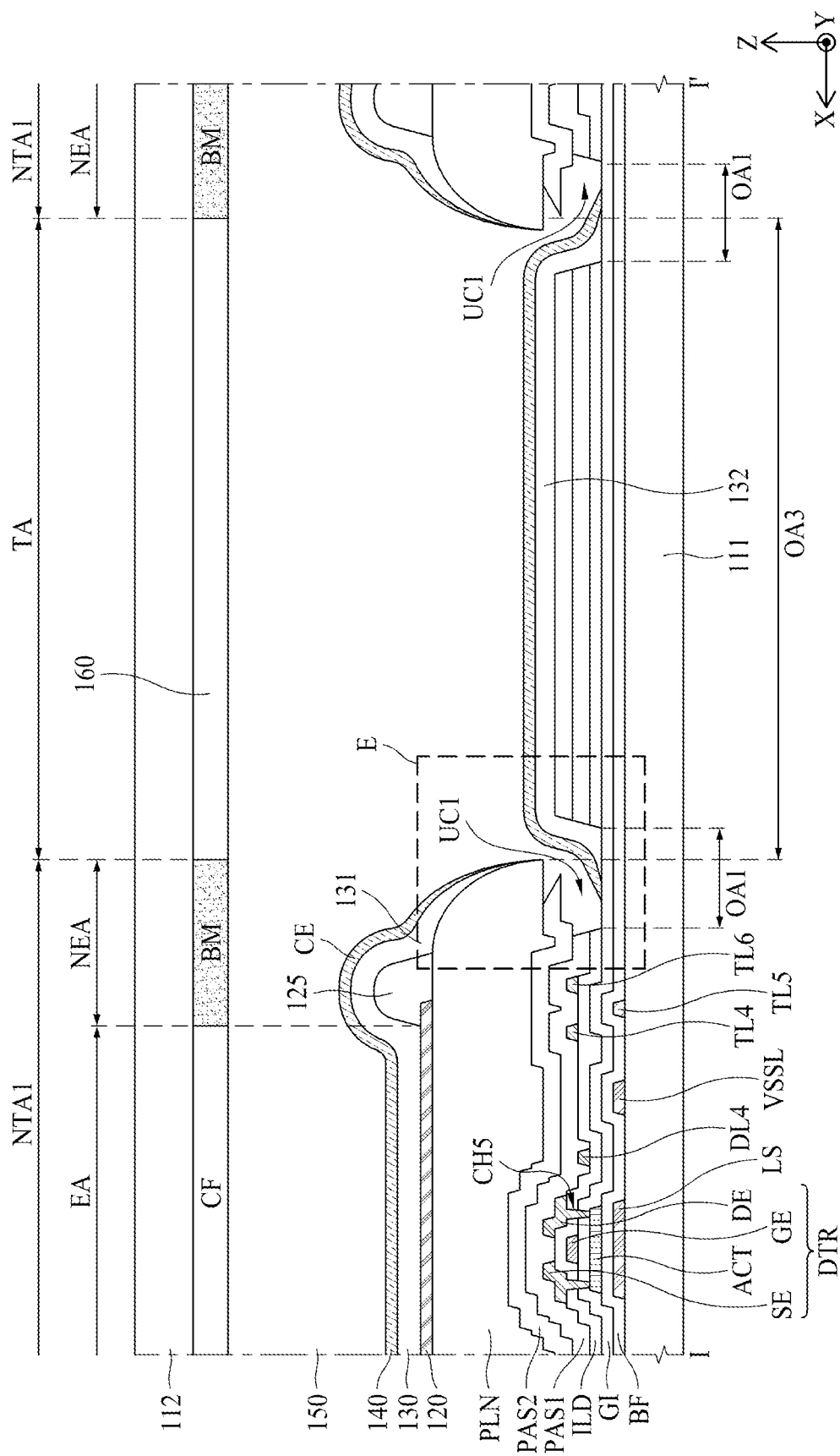
FIG. 13 is cross-sectional view illustrating another example of line I-I' of FIG. 3.
Figure 14:
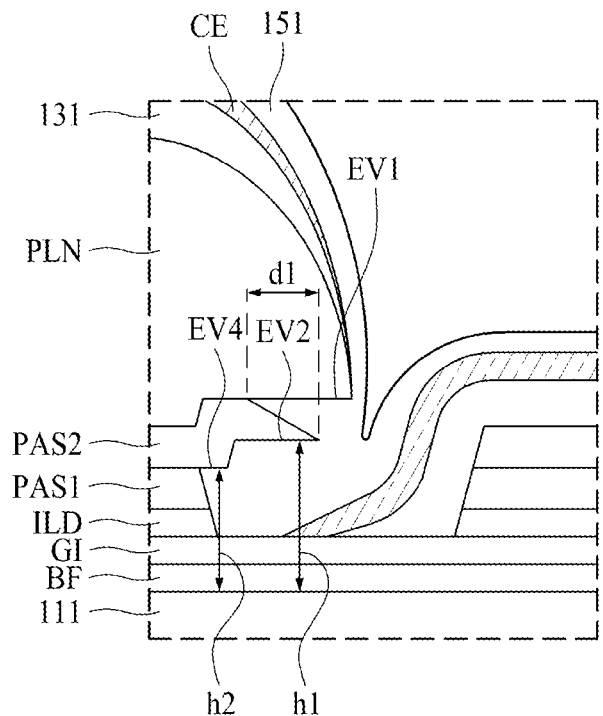
FIG. 14 is an enlarged view illustrating an example of a first undercut structure provided in an area E of FIG. 13.
Figure 15:
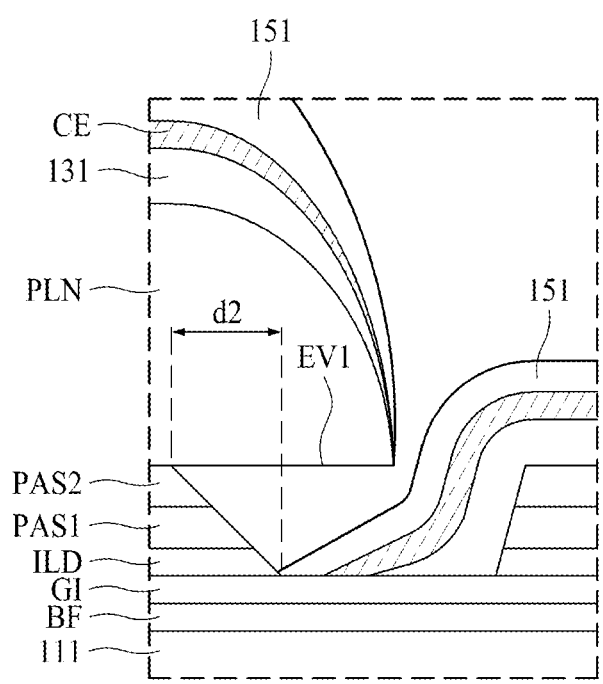
FIG. 15 is a view illustrating an encapsulation layer provided in a first undercut structure when the first undercut structure includes a single eave.
Figure 16:
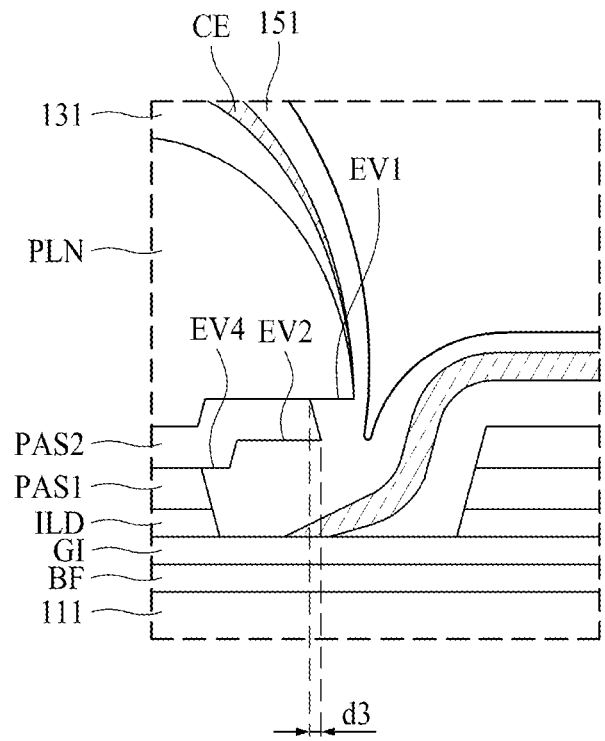
FIG. 16 is an enlarged view illustrating another example of a first undercut structure provided in an area E of FIG. 13.

FIG. 13 is cross-sectional view illustrating another example of line I-I' of FIG. 3, FIG. 14 is an enlarged view illustrating an example of a first undercut structure provided in an area E of FIG. 13, FIG. 15 is a view illustrating an encapsulation layer provided in a first undercut structure when the first undercut structure includes a single eave, FIG. 16 is an enlarged view illustrating another example of a first undercut structure provided in an area E of FIG. 13, and FIGS. 17A to 17G are views illustrating a process of forming a first undercut structure of FIG. 13.

The first undercut structure UC1 according to another embodiment of the present disclosure may be formed using the planarization layer PLN and the plurality of inorganic insulating layers, for example, the first and second passivation layers PAS1 and PAS2 and the interlayer dielectric layer ILD. In detail, the first undercut structure UC1 may include a plurality of eaves EV. The first undercut structure UC1 may include a first eave EV1 of the planarization layer PLN, a second eave EV2 and a fourth eave EV4 of the second passivation layer PAS2.

The first eave EV1 may be formed in such a manner that the planarization layer PLN is more protruded than the plurality of inorganic insulating layers, for example, the first passivation layer PAS1, the second passivation layer PAS2 and the interlayer dielectric layer ILD in a direction of the transmissive area TA. At this time, the first eave EV1 may overlap at least a portion of the first opening area OA1 of the first passivation layer PAS1 and at least a portion of the second opening area OA2 of the second passivation layer PAS2.

Therefore, the first undercut structure UC1 may expose at least a portion of the lower surface of the planarization layer PLN. The first undercut structure UC1 may not include the plurality of inorganic insulating layers, for example, the first passivation layer PAS1, the second passivation layer PAS2 and the interlayer dielectric layer ILD below the exposed lower surface, and may form a gap space with the gate insulating layer GI or the buffer layer BF.

The second eave EV2 and the fourth eave EV4 may be formed in such a manner that the second passivation layer PAS2 is more protruded than some of the plurality of inorganic insulating layers, for example, the first passivation layer PAS1 and the interlayer dielectric layer ILD in a direction of the transmissive area TA. At this time, the second eave EV2 and the fourth eave EV4 may overlap at least a portion of the first opening area OA1 of the first passivation layer PAS1. At this time, the second opening area OA2 of the second passivation layer PAS2 may have a width smaller than that of the first opening area OA1 of the first passivation layer PAS1.

The second eave EV2 and the fourth eave EV4 may be provided at their respective heights different from each other. The second eave EV2 may be provided at a first height h1 from the first substrate 111, and the fourth eave EV4 may be provided at a second height h2 from the first substrate 111. At this time, the second height h2 may be smaller than the first height h1.

Also, the second eave EV2 and the fourth eave EV4 may be different from each other in positions of their ends. The end of the second eave EV2 may be more protruded than that of the fourth eave EV4 in a direction of the transmissive area TA.

Figure 17A:
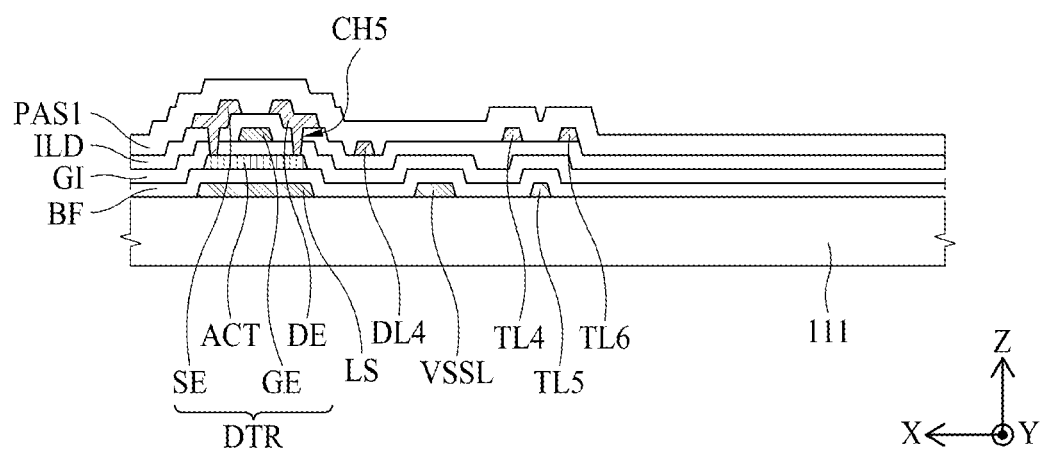
FIGS. 17A to 17G are views illustrating a process of forming a first undercut structure of FIG. 13.

The first eave EV1, the second eave EV2 and the fourth eave EV4 may be formed through a wet etching process or a dry etching process. In more detail, as shown in FIG. 17A, a driving transistor DTR and a plurality of signal lines DL4, VSSL, TL4, TL5 and TL6 may be provided over the first substrate 111. The first passivation layer PAS1 may be provided over the driving transistor DTR and the plurality of signal lines DL4, VSSL, TL4, TL5 and TL6. The first passivation layer PAS1 may be deposited on an entire surface of a display area.

Figure 17B:
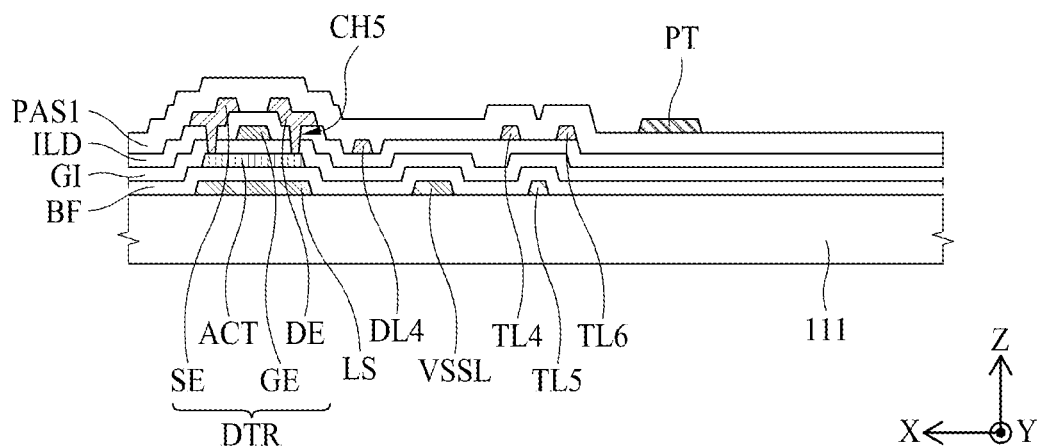
Figure 17C:
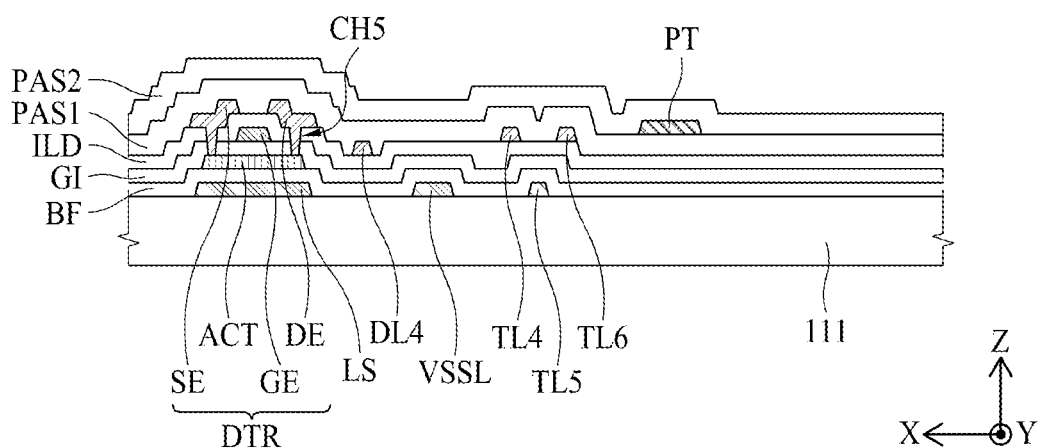

As shown in FIG. 17B, a sacrificial pattern PT may be formed on the first passivation layer PAS1. The sacrificial pattern PT may be a metal pattern. Next, as shown in FIG. 17C, the second passivation layer PAS2 may be deposited on the entire surface of the display area on the first passivation layer PAS1 and the sacrificial pattern PT.

Figure 17D:
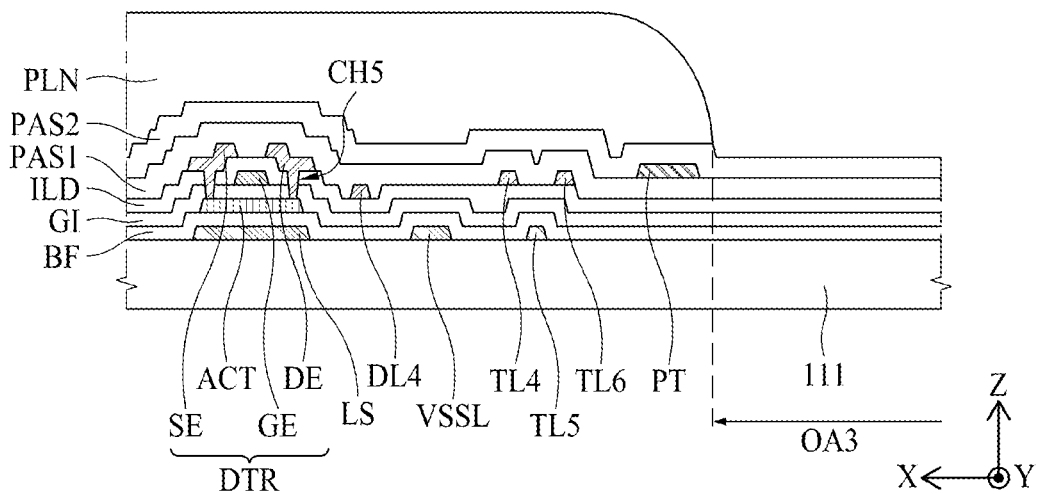

As shown in FIG. 17D, the planarization layer PLN may be formed to be patterned on the second passivation layer PAS2. At this time, the planarization layer PLN may be provided in the non-transmissive area NTA, and may not be provided in the transmissive area TA.

Figure 17E:
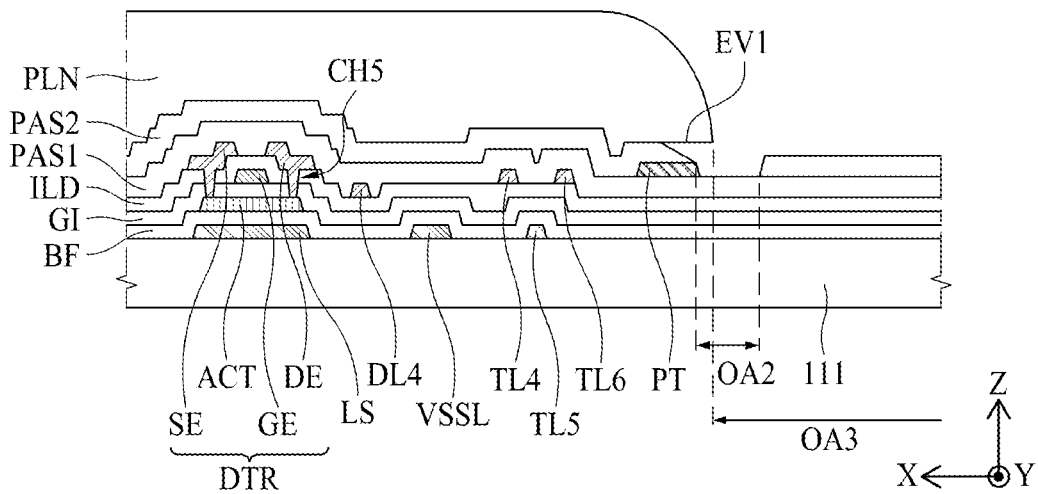

Then, the second passivation layer PAS2 may be etched as shown in FIG. 17E.

In one embodiment, at least a portion of the second passivation layer PAS2 may be etched through the first wet etching process to form the second opening area OA2. For example, the first wet etching process may be BOE, and may be isotropic etching in view of characteristics. In the transparent display panel 110 according to another embodiment of the present disclosure, the first wet etching process may be performed for the second passivation layer PAS2 to form the second opening area OA2, whereby the first eave EV1 may be formed. Therefore, in the transparent display panel 110 according to another embodiment of the present disclosure, the second passivation layer PAS2 provided below the edge area of the planarization layer PLN is etched, so that at least a portion of the lower surface of the planarization layer PLN may be exposed.

In another embodiment, the second passivation layer PAS2 may be formed through a dry etching process.

Figure 17F:
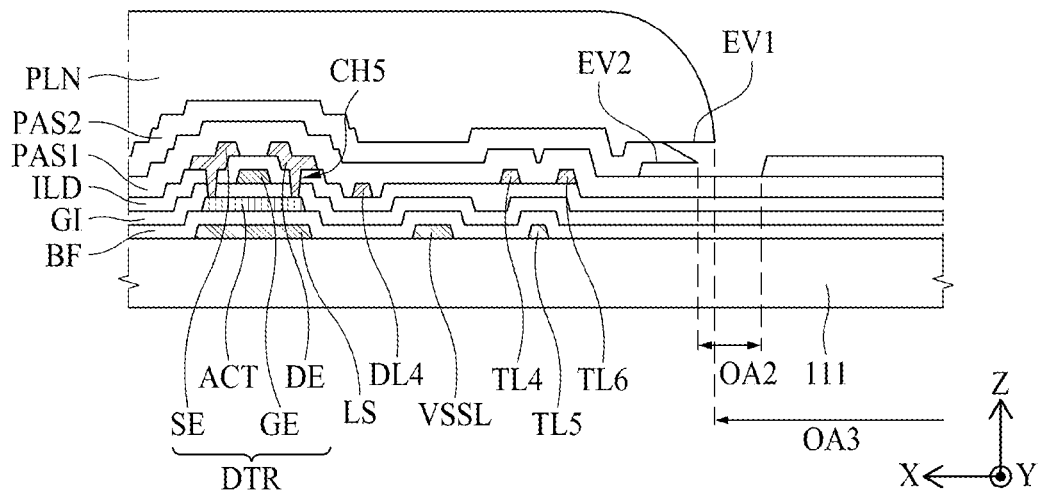

Next, as shown in FIG. 17F, the sacrificial pattern PT may be etched. In one embodiment, the sacrificial pattern PT may be removed through the second wet etch process. Therefore, the second wet etching process may be performed for the sacrificial pattern PT according to another embodiment of the present disclosure to remove the sacrificial pattern PT, whereby the second eave EV2 may be formed. As a result, in the transparent display panel 110 according to another embodiment of the present disclosure, the sacrificial pattern PT provided below the edge area of the second passivation layer PAS2 is removed, and at the same time at least a portion of the lower surface of the second passivation layer PAS2 may be exposed.

Figure 17G:
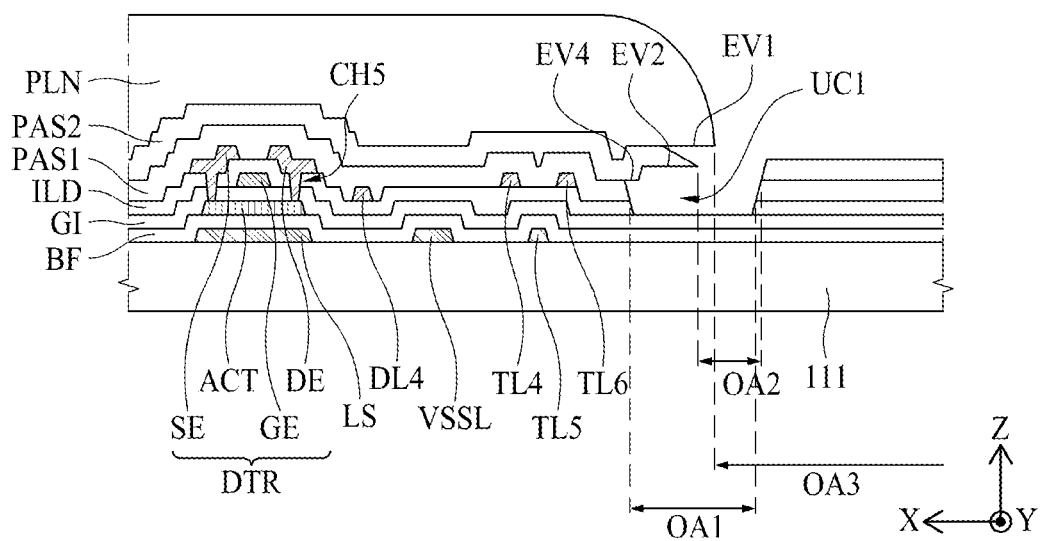

Next, as shown in FIG. 17G, the first passivation layer PAS1 may be etched.

In one embodiment, at least a portion of the first passivation layer PAS1 may be etched through the third wet etching process to form the first opening area OA1. For example, the third wet etching process may be BOE, and may be isotropic etching in view of characteristics. In the transparent display panel 110 according to another embodiment of the present disclosure, the third wet etching process may be performed for the first passivation layer PAS1 to form the first opening area OA1, whereby the fourth EA4 area may be formed. As a result, in the transparent display panel 110 according to another embodiment of the present disclosure, the first passivation layer PAS1 provided below a portion of the second passivation layer PAS2 is etched, and at the same time at least a portion of the lower surface of the second passivation layer PAS2 may be exposed.

The first undercut structure UC1 formed through the above-described manufacturing process may expose at least a portion of the lower surface of the second passivation layer PAS2. The first undercut structure UC1 may not include some of a plurality of inorganic insulating layers, for example, the first passivation layer PAS1 and the interlayer dielectric layer ILD below the exposed lower surface, and may form a gap space with the gate insulating layer GI or the buffer layer BF.

The first undercut structure UC1 is provided in the transmissive area TA, and may have a planar closed shape. For example, the first undercut structure UC1 may be formed along the edge of the transmissive area TA. At this time, the first undercut structure UC1 may be formed to surround the touch sensor TS.

Unlike the first undercut structure UC1 shown in FIGS. 6 to 8, the first undercut structure UC1 according to another embodiment of the present disclosure does not include a metal pattern MP, and may be provided with a plurality of eaves EV1, EV2 and EV3 formed using only the planarization layer PLN and the plurality of inorganic insulating layers. Therefore, the transparent display panel 110 shown in FIGS. 13 and 14 may improve light transmittance in comparison with the transparent display panel 110 shown in FIGS. 6 to 8.

Also, in the first undercut structure UC1 according to another embodiment of the present disclosure, as shown in FIG. 15, an encapsulation layer 150 may be uniformly deposited on the entire surface without being disconnected, in comparison with the first undercut structure UC1 that includes only one eave EV. In detail, the encapsulation layer 150 may be provided on the cathode electrode CE and the touch sensor electrode TSE. At this time, the encapsulation layer 150 may be formed to at least partially cover the first undercut structure UC1 disposed between the cathode electrode CE and the touch sensor electrode TSE.

However, when one eave EV is formed through the wet etching process as shown in FIG. 15, isotropic etching is performed so that one eave EV may be formed to be deep in a horizontal direction. That is, in FIG. 15, a second distance d2 between ends of the interlayer dielectric layer ILD below the first undercut structure UC1 may be increased at a point where the eave EV and the second passivation layer PAS2 meet. When the encapsulation layer 150, particularly, an inorganic layer 151 is deposited on the first undercut structure UC1 formed as above, the encapsulation layer 150 is disconnected from the first undercut structure UC1 without being connected as shown in FIG. 15, whereby encapsulation performance of the transparent display panel 110 may be deteriorated.

The first undercut structure UC1 according to another embodiment of the present disclosure forms the plurality of eaves EV1, EV2 and EV4 through the plurality of wet etching processes, so that a horizontal depth of each of the plurality of eaves EV1, EV2 and EV4 may be reduced. That is, in FIG. 14, a first distance d1 between ends of the second passivation layer PAS2 may be smaller than the second distance d2 in FIG. 15 at a point where the first eave EV1 and the second passivation layer PAS2 meet.

In the first undercut structure UC1 according to another embodiment of the present disclosure, the encapsulation layer 150, particularly, the inorganic layer 151 may be connected without being disconnected. Therefore, encapsulation performance of the transparent display panel 110 may be improved.

Furthermore, the first undercut structure UC1 according to another embodiment of the present disclosure may form the first eave EV1 through a dry etching process. Since the dry etching process performs anisotropic etching, a third distance d3 between the ends of the second passivation layer PAS2 may be smaller than the first distance d1 in FIG. 14 at the point where the first eave EV1 and the second passivation layer PAS2 meet. Therefore, encapsulation performance of the transparent display panel 110 may be further improved.

According to the present disclosure, the following advantageous effects may be obtained.

In the present disclosure, the touch sensor electrode of the touch sensor and the cathode electrode of the light emitting element may be simultaneously formed using the first undercut structure, so that the touch process is simplified and a separate mask for the touch sensor electrode does not need to be added.

Also, in the present disclosure, as the first undercut structure includes the plurality of eaves, the touch sensor electrode of the touch sensor and the cathode electrode of the light emitting element may be effectively separated from each other without reducing the area of the touch sensor. Therefore, short-circuit between the touch sensor electrode of the touch sensor and the cathode electrode of the light emitting element may be prevented from occurring.

Also, in the present disclosure, the horizontal length of the eave of the first undercut structure may be reduced. Therefore, in the present disclosure, the encapsulation layer may be connected without being disconnected on the first undercut structure, and encapsulation performance of the display panel may be improved.

Also, in the present disclosure, the first undercut structure is formed using the planarization layer and the plurality of inorganic insulating layers, so that loss of light transmittance due to the first undercut structure may be reduced or minimized.

Also, in the present disclosure, the touch sensor electrode and the touch contact electrode may be connected to each other using the second undercut structure. At this time, the second undercut structure is formed using only the planarization layer and the plurality of inorganic insulating layers, so that the contact structure between the touch sensor electrode and the touch contact electrode may be implemented without loss of light transmittance due to the second undercut structure.

Also, in the present disclosure, the touch sensor electrode is to be in contact with the side or the lower surface of the touch contact electrode by the second undercut structure, so that the area of the touch contact electrode may be reduced. Therefore, the present disclosure may reduce loss of light transmittance due to the touch contact electrode.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
a substrate provided with a plurality of transmissive areas and a non-transmissive area including a plurality of light emission areas;
a plurality of light emitting elements respectively disposed in the plurality of light emission areas on the substrate, each of the plurality of light emitting elements including an anode electrode, a light emitting layer, and a cathode electrode;
a plurality of touch sensors respectively disposed in the plurality of transmissive areas on the substrate, each of the plurality of touch sensors including a touch sensor electrode; and a first undercut structure disposed along an edge of the transmissive area and separating the cathode electrode from the touch sensor electrode, the first undercut structure including a plurality of eaves;
wherein the first undercut structure includes:
a first passivation layer disposed on the substrate, including a first opening area provided along the edge of the transmissive area;
a second passivation layer disposed on the first passivation layer, including a second opening area provided to at least partially overlap the first opening area; a planarization layer disposed on the second passivation layer, including a third opening area provided to at least partially overlap the first and second opening areas;
a first eave in which the planarization layer is more protruded than the second passivation layer in a direction of the transmissive area to overlap at least a portion of the second opening area; and
a second eave in which the second passivation layer is more protruded than the first passivation layer in the direction of the transmissive area to overlap at least a portion of the first opening area.

2. The transparent display device of claim 1, wherein the first undercut structure includes: a metal pattern provided between the first passivation layer and the second passivation layer; and a third eave in which the metal pattern is more protruded than the first passivation layer in the direction of the transmissive area to overlap at least a portion of the first opening area.

3. The transparent display device of claim 2, wherein the metal pattern is disposed along the edge of the transmissive area.

4. The transparent display device of claim 2, wherein the metal pattern is electrically floated.

5. The transparent display device of claim 1, wherein an end of the touch sensor electrode is disposed below the first eave and the second eave.

6. The transparent display device of claim 1, wherein the second opening area has a width smaller than that of the first opening area.

7. The transparent display device of claim 1, wherein the third opening area fully overlaps the touch sensor.

8. The transparent display device of claim 7, wherein the second eave is provided at a first height,
wherein the fourth eave is provided at a second height lower than the first height, and
wherein an end of the second eave is more protruded than that of the fourth eave in the direction of the transmissive area.

9. The transparent display device of claim 1, wherein the first undercut structure further includes a fourth eave in which the second passivation layer is more protruded than the first passivation layer in the direction of the transmissive area, and
wherein the fourth eave is provided at a height different from that of the second eave.

10. The transparent display device of claim 1, further comprising a touch contact electrode disposed to overlap the touch sensor electrode in the transmissive area, being in contact with the touch sensor electrode by a second undercut structure.

11. The transparent display device of claim 10, wherein the second undercut structure includes:
a first passivation layer disposed on the substrate, including a fourth opening area provided in the transmissive area;
a second passivation layer disposed on the first passivation layer in the transmissive area, including a fifth opening area provided to at least partially overlap the fourth opening area; and
an organic pattern disposed on the second passivation layer in the transmissive area and provided to overlap at least a portion of the fourth opening area and at least a portion of the fifth opening area.

12. The transparent display device of claim 11, wherein the touch contact electrode is provided below the first passivation layer and its upper surface is exposed by the fourth opening area and the fifth opening area, and
wherein the touch sensor electrode is in contact with the exposed upper surface of the touch contact electrode.

13. The transparent display device of claim 12, further comprising a driving transistor provided between the first passivation layer and the substrate,
wherein the touch contact electrode is provided in a same layer as the source electrode and the drain electrode of the driving transistor.

14. The transparent display device of claim 11, wherein the touch contact electrode is provided between the first passivation layer and the second passivation layer and its side is exposed by the fifth opening area, and
wherein the touch sensor electrode is in contact with the exposed side of the touch contact electrode.

15. The transparent display device of claim 14, wherein the touch sensor electrode has a lower surface exposed by the fourth opening area, and
wherein the touch sensor electrode is in contact with the exposed lower surface of the touch contact electrode.

16. The transparent display device of claim 14, further comprising:
a driving transistor provided between the first passivation layer and the substrate; and
a connection electrode provided below the first passivation layer,
wherein the connection electrode is provided in a same layer as the source electrode and the drain electrode of the driving transistor, and
wherein the touch contact electrode is coupled to the connection electrode through a contact hole.

17. The transparent display device of claim 11, wherein the second undercut structure further includes a fifth eave in which the organic pattern is provided in the fifth opening area.

18. The transparent display device of claim 10, further comprising:
a plurality of touch lines provided in the non-transmissive area on the substrate and extended in a first direction; and
a bridge line provided in the non-transmissive area on the substrate and extended in a second direction to couple at least two touch sensors arranged in the second direction with one of the plurality of touch lines,
wherein the touch contact electrode is electrically connected to the bridge line.

19. A transparent display device comprising:
a substrate having a plurality of transmissive areas and a non-transmissive area;
a plurality of light emission areas that at least partially overlap the non-transmissive area;
a plurality of light emitting elements respectively disposed in the plurality of light emission areas on the substrate, each of the plurality of light emitting elements including an anode electrode, a light emitting layer, and a cathode electrode;
a plurality of touch sensors respectively disposed in the plurality of transmissive areas on the substrate, each of the plurality of touch sensors including a touch sensor electrode; and
a first undercut structure disposed along an edge of the transmissive area and separating the cathode electrode from the touch sensor electrode, the first undercut structure including at least one eave;
wherein the first undercut structure includes:
a first passivation layer disposed on the substrate;
a first opening area in the first passivation layer, the first opening located along the edge of the transmissive area;
a second passivation layer disposed on the first passivation layer;
a second opening area in the second passivation layer, the second opening located to at least partially overlap the first opening area;
a planarization layer disposed on the second passivation layer;
a third opening area in the planarization layer, the third located to at least partially overlap the first and second opening areas; and
a first eave in which the planarization layer is more protruded than the second passivation layer in a direction of the transmissive area to overlap at least a portion of the second opening area.

20. The transparent display device of claim 19 further comprising:
a second eave in which the second passivation layer is more protruded than the first passivation layer in the direction of the transmissive area to overlap at least a portion of the first opening area.

* * * * *